(12) United States Patent
Takahashi et al.

(10) Patent No.: US 12,487,126 B2
(45) Date of Patent: Dec. 2, 2025

(54) THERMOPILE SENSOR AND SENSOR ARRAY

(71) Applicant: Panasonic Intellectual Property Management Co., Ltd., Osaka (JP)

(72) Inventors: Kouhei Takahashi, Osaka (JP); Masaki Fujikane, Osaka (JP); Hiroyuki Tanaka, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 55 days.

(21) Appl. No.: 18/496,316

(22) Filed: Oct. 27, 2023

(65) Prior Publication Data

US 2024/0068875 A1 Feb. 29, 2024

Related U.S. Application Data

(63) Continuation of application No. PCT/JP2022/018143, filed on Apr. 19, 2022.

(30) Foreign Application Priority Data

May 11, 2021 (JP) .................................. 2021-080449

(51) Int. Cl.
*G01J 5/12* (2006.01)
*H10N 10/17* (2023.01)

(52) U.S. Cl.
CPC ................ *G01J 5/12* (2013.01); *H10N 10/17* (2023.02); *G01J 2005/123* (2013.01)

(58) Field of Classification Search
CPC .................................... G01J 5/12; H10N 10/17
See application file for complete search history.

(56) References Cited

U.S. PATENT DOCUMENTS

2015/0015930 A1 1/2015 Hussein et al.
2017/0356806 A1 12/2017 Takahashi et al.
(Continued)

FOREIGN PATENT DOCUMENTS

CN 110514315 A * 11/2019
JP 2009-180682 8/2009
(Continued)

OTHER PUBLICATIONS

Huang et al., CN 110514315 A, English Machine Translation. (Year: 2019).*

(Continued)

*Primary Examiner* — Tae-Sik Kang
(74) *Attorney, Agent, or Firm* — Wenderoth, Lind & Ponack, L.L.P.

(57) ABSTRACT

A thermopile sensor according to the present disclosure includes a p-type portion and an n-type portion. The p-type portion has a first phononic crystal in which first holes are arranged in a plan view. The n-type portion has a second phononic crystal in which second holes are arranged in a plan view. The p-type portion and the n-type portion constitute a thermocouple. The boundary scattering frequency of phonons in the first phononic crystal is different from the boundary scattering frequency of phonons in the second phononic crystal. Alternatively, the ratio of the sum of the areas of the first holes to the area of the first phononic crystal in a plan view is different from the ratio of the sum of the areas of the second holes to the area of the second phononic crystal in a plan view.

10 Claims, 25 Drawing Sheets

(56) References Cited

U.S. PATENT DOCUMENTS

| | | | |
|---|---|---|---|
| 2020/0003625 A1* | 1/2020 | Tambo | G01J 5/12 |
| 2021/0302237 A1 | 9/2021 | Takahashi et al. | |
| 2022/0216387 A1 | 7/2022 | Fujikane et al. | |

FOREIGN PATENT DOCUMENTS

| | | |
|---|---|---|
| JP | 2017-223644 | 12/2017 |
| WO | 2020/174731 | 9/2020 |
| WO | 2021/079732 | 4/2021 |

OTHER PUBLICATIONS

International Search Report of PCT application No. PCT/JP2022/018143 dated Jul. 12, 2022.

M. Nomura et al., "Impeded thermal transport in Si multiscale hierarchical architectures with phononic crystal nanostructures", Physical Review B 91, May 15, 2015, 205422.

Jin Xie et al., "Characterization of heavily doped polysilicon films for CMOS-MEMS thermoelectric power generators", Journal of Micromechanics and Microengineering, vol. 19(2009), Nov. 16, 2009, p. 125029.

Extended European Search Report issued Sep. 10, 2024 in corresponding European Patent Application No. 22807313.6.

Masahiro Nomura et al., "Electrical and thermal properties of polycrystalline Si thin films with phononic crystal nanopatterning for thermoelectric applications", Applied Physics Letters, vol. 106, No. 22, p. 223106-1-223106-5, Jun. 2, 2015, XP012197923.

\* cited by examiner

THERMOPILE SENSOR AND SENSOR ARRAY

BACKGROUND

1. Technical Field

The present disclosure relates to a thermopile sensor and a sensor array.

2. Description of the Related Art

To date, a thermopile sensor including a material having a phononic crystal is known.

For example, Japanese Unexamined Patent Application Publication No. 2017-223644 describes a thermopile infrared sensor including a beam that is a thin-film-like member having a two-dimensional phononic crystal. In the two-dimensional phononic crystal, through-holes having arbitrary diameters are arranged in a plane at an arbitrary period. The beam functions as a thermopile. According to Japanese Unexamined Patent Application Publication No. 2017-223644, it is possible to improve the sensitivity of an infrared sensor by introducing a phononic crystal into a beam of an infrared receiver.

In addition, U.S. Patent Application Publication No. 2015/0015930 and "Nomura et al., 'Impeded thermal transport in Si multiscale hierarchical architectures with phononic crystal nanostructures', Physical Review B 91, 205422 (2015)" each disclose a periodic structure constituted by through-holes that reduce the thermal conductivity of a thin film. In the periodic structure, the through-holes are regularly arranged with a period of a nanometer order in the range from 1 nanometer (nm) to 1000 nm in a plan view of the thin film. The periodic structure is a type of a phononic crystal structure.

SUMMARY

The technology described above has room for reexamination from the viewpoint of reducing the risk of breakage of a member in a thermopile sensor.

One non-limiting and exemplary embodiment provides a technology that is advantageous from the viewpoint of reducing the risk of breakage of a member in a thermopile sensor.

In one general aspect, the techniques disclosed here feature a thermopile sensor. The thermopile sensor includes: a p-type portion that includes a p-type material and has a first phononic crystal in which first holes are arranged in a plan view; and an n-type portion that includes an n-type material and has a second phononic crystal in which second holes are arranged in a plan view. The p-type portion and the n-type portion constitute a thermocouple. The thermopile sensor satisfies at least one condition selected from a group consisting of the following (I) and (II): (I) a boundary scattering frequency of phonons in the first phononic crystal is different from a boundary scattering frequency of phonons in the second phononic crystal; and (II) a ratio of a sum of areas of the first holes to an area of the first phononic crystal in a plan view of the first phononic crystal is different from a ratio of a sum of areas of the second holes to an area of the second phononic crystal in a plan view of the second phononic crystal.

The thermopile sensor according to the present disclosure is advantageous from the viewpoint of reducing the risk of breakage of a member.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1A:
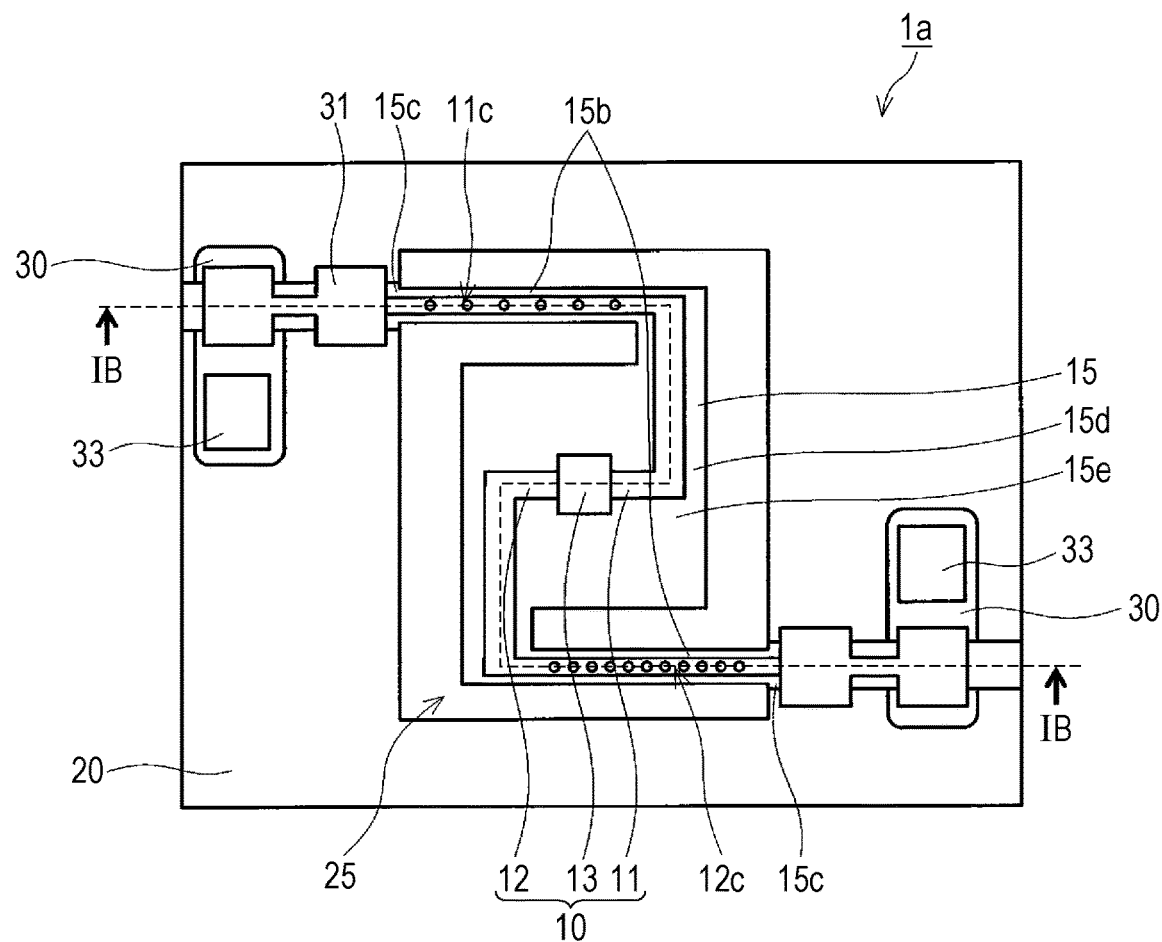
FIG. 1A is a plan view schematically illustrating a thermopile sensor according to a first embodiment.

Underlying Knowledge Forming Basis of the Present Disclosure

A thermopile sensor includes a thermocouple including a p-type material and an n-type material. In the p-type material, holes behave as carriers for electrical conduction; and, in the n-type material, electrons behave as carriers for electrical conduction. As an example of the thermocouple in the thermopile sensor, a structure that has a hot junction in a sensing portion, which is spanned over a substrate by using a beam, and that has a cold junction on the substrate is conceivable. It is conceivable that, with this structure, the sensing portion of the thermocouple, having the hot junction, is not likely to be affected by heat of the substrate. It is conceivable that such a thermopile sensor can function as an infrared sensor when an infrared receiver that absorbs infrared rays is added to the spanned sensing portion in the thermopile sensor. In addition, it is conceivable that such a thermopile sensor can function as a gas sensor when a catalyst layer that reacts to a specific gas is added to the spanned sensing portion in the thermopile sensor. In such a thermopile sensor, the performance of the sensor, such as infrared ray detection sensitivity or gas detection sensitivity, tends to increase as the thermal insulation performance of the beam increases.

It is conceivable that the thermal conductivity of a member can be reduced by making the member porous. A member having a phononic crystal can have a thermal insulation performance that exceeds the classical effect of reduction of thermal conductance due to decrease in the volume of the member by making the member porous. For example, Japanese Unexamined Patent Application Publication No. 2017-223644 describes that the sensitivity of an infrared sensor can be improved by introducing a phononic crystal into a beam of an infrared receiver.

It is assumed that a p-type material and an n-type material of a thermocouple in a thermopile sensor have different thermo-physical properties. For example, Journal of Micromechanics and Microengineering 19, 125029 (2009) describes that the thermal conductivities of an n-type material and a p-type material whose base material is polysilicon are considerably different from each other. In a case where the thermal conductivities of a p-type material and an n-type material of a thermocouple of a thermopile sensor are different from each other, when the sensing portion detects infrared rays or a gas and the temperature of the sensing portion increases, the temperature distribution of the thermocouple may become nonuniform. As a result, a thermal stress is generated in the thermocouple. When the thermocouple is subjected to a sudden change in temperature or when the temperature gradient in the thermocouple is large, a large thermal stress may be generated in the thermocouple. If the generated thermal stress exceeds the yield stress of a member of the thermocouple, a crack or a permanent deformation occurs in the thermocouple. According to an examination by the inventors, among portions of a thermopile sensor into which a phononic crystal has been introduced in order to increase the thermal insulation performance, the temperature of a sensing portion tends to increase considerably when the thermopile sensor detects a detection target such as infrared rays or a gas. In this case, the risk of breakage of a member of the thermopile sensor due to a thermal stress tends to increase.

The inventors have intensely examined technologies expected to be advantageous from the viewpoint of reducing the risk of breakage of a member of the thermopile sensor. As a result, the inventors have found that it is possible to reduce a thermal stress by regulating a phononic crystal so that the boundary scattering frequencies of phonons in a p-type portion and an n-type portion of a thermocouple have a predetermined relationship. In addition, the inventors have found that it is possible to reduce a thermal stress by regulating the ratio of the sum of the areas of holes to the area of a phononic crystal in a plan view in a p-type portion and an n-type portion of a thermocouple. Based on these findings, the inventors have devised a thermopile sensor according to the present disclosure.

Summary of One Aspect According to Present Disclosure

The present disclosure provides the following thermopile sensor.

The thermopile sensor includes:
 a p-type portion that includes a p-type material and has a first phononic crystal in which first holes are arranged in a plan view; and
 an n-type portion that includes an n-type material and has a second phononic crystal in which second holes are arranged in a plan view.

The p-type portion and the n-type portion constitute a thermocouple.

The thermopile sensor satisfies at least one condition selected from a group consisting of the following (I) and (II):
 (I) a boundary scattering frequency of phonons in the first phononic crystal is different from a boundary scattering frequency of phonons in the second phononic crystal; and
 (II) a ratio of a sum of areas of the first holes to an area of the first phononic crystal in a plan view of the first phononic crystal is different from a ratio of a sum of areas of the second holes to an area of the second phononic crystal in a plan view of the second phononic crystal.

The thermopile sensor is advantageous from the viewpoint of reducing the risk of breakage of a member, because a thermal stress generated in the thermocouple tends to be small.

EMBODIMENTS OF PRESENT DISCLOSURE

Hereafter, embodiments of the present disclosure will be described with reference to the drawings. Embodiments described below each give a general or specific example. Numerical values, shapes, elements, the dispositions of the elements, the connections between the elements, steps, and the order of the steps described in the following embodiments are examples, and are not intended to limit the present disclosure. Elements of the following embodiments that are not described in an independent claim that represents the broadest concept will be described as optional elements. Each of the figures is a schematic view, and is not necessarily drawn strictly.

First Embodiment

Figure 1B:
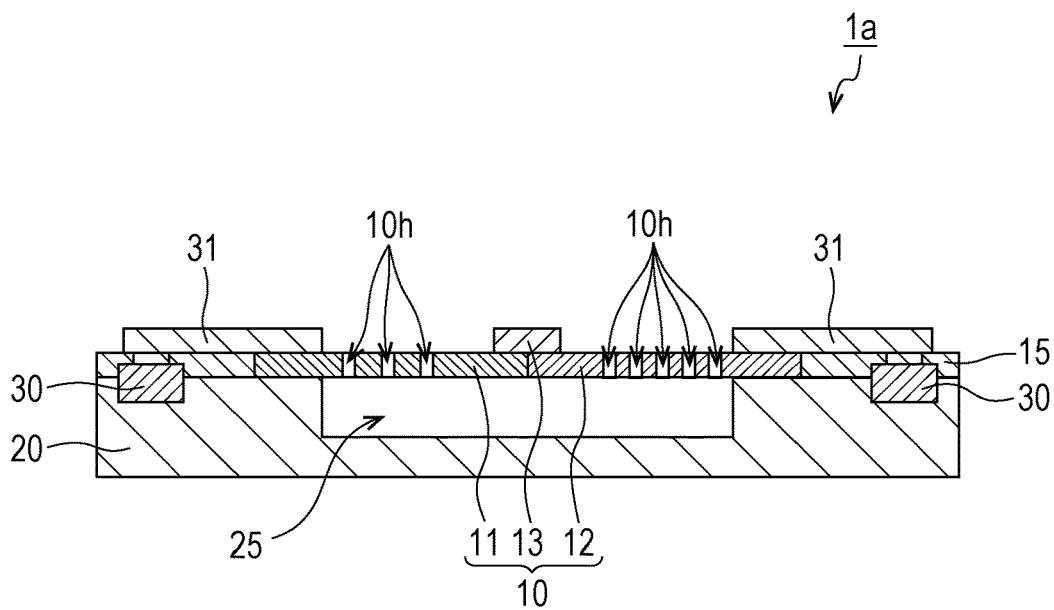
FIG. 1B is a sectional view of the thermopile sensor of FIG. 1A taken along line IB-IB.

FIGS. 1A and 1B illustrate a thermopile sensor 1a according to a first embodiment. The thermopile sensor 1a includes a p-type portion 11 and an n-type portion 12. The p-type portion 11 includes a p-type material. In addition, the p-type portion 11 has a first phononic crystal 11c in which holes 10h are arranged in a plan view. The n-type portion 12 includes an n-type material. In addition, the n-type portion 12 has a second phononic crystal 12c in which holes 10h are arranged in a plan view. In the thermopile sensor 1a, the p-type portion 11 and the n-type portion 12 constitute a thermocouple 10. The thermopile sensor 1a satisfies at least one condition selected from a group consisting of the following (I) and (II).
 (I) The boundary scattering frequency of phonons in the first phononic crystal 11c is different from the boundary scattering frequency of phonons in the second phononic crystal 12c.
 (II) A ratio R1 is different from a ratio R2. The ratio R1 is the ratio of the sum of the areas of the holes 10h to the area of the first phononic crystal 11c in a plan view of the first phononic crystal 11c. The ratio R2 is the ratio of the sum of the areas of the holes 10h to the area of the second phononic crystal 12c in a plan view of the second phononic crystal 12c.

In an insulator and a semiconductor, heat is mainly carried by phonons, each of which is a quasi-particle that is quantization of lattice vibration. The thermal conductivity of a material including an insulator or a semiconductor is determined by the dispersion relation of phonons in the material. The dispersion relation of phonons may include the relation between frequency and wavenumber or a band structure. The frequency range of phonons that carry heat in an insulator and a semiconductor encompasses a wide range from 100 GHz to 10 THz. The thermal conductivity of a material including an insulator or a semiconductor is determined by the behavior of phonons in the frequency range. Phonons have, for each frequency, a finite mean free path that is determined by scattering caused by the phonons themselves and scattering caused by impurities. The mean free path corresponds to a distance that phonons can travel without being obstructed by scattering. Phonons have a mean free path in a wide range from several angstroms to several micrometers in accordance with frequency. Phonons having a long mean free path mainly carry heat in a material having a high thermal conductivity, and phonons having a short mean free path mainly carry heat in a material having a low thermal conductivity.

With a phononic crystal, the boundary scattering frequency of phonons can be regulated due to a structure in which holes are arranged, and the effective mean free path of phonons can be adjusted. As the representative length of the structure or the like becomes shorter, the boundary scattering frequency of phonons becomes higher. Therefore, for example, the boundary scattering frequency of phonons can be regulated by adjusting at least one condition selected from a group consisting of the following (i), (ii), and (iii). As the boundary scattering frequency of phonons increases, the thermal conductivity of the structure decreases. In addition, it is possible to regulate the effective thermal conductance of a phononic crystal by adjusting the following (ii).

(i) the shortest distance between the nearest holes in a plan view of the phononic crystal
(ii) the ratio of the sum of the areas of holes to the area of the phononic crystal in a plan view
(iii) the specific surface area of the phononic crystal For example, the thermal conductivity of the p-type material included in the p-type portion 11 and the thermal conductivity of the n-type material included in the n-type portion 12 are different from each other. On the other hand, the boundary scattering frequency of phonons in the first phononic crystal 11c is different from the boundary scattering frequency of phonons in the second phononic crystal 12c. Alternatively, the ratio R1 is different from the ratio R2. Thus, the difference between the thermal conductivity of the p-type portion 11 and the thermal conductivity of the n-type portion 12 can be reduced, and the temperature distribution in the thermocouple 10 tends to be uniform. As a result, a thermal stress generated in the thermocouple 10 tends to be small, and the risk of breakage of a member, such as the thermocouple 10, in the thermopile sensor 1a is low. In the present specification, thermal conductivity means, for example, a value at 25° C.

As illustrated in FIGS. 1A and 1B, the thermopile sensor 1a includes a substrate 20 and a sensor layer 15. The sensor layer 15 includes the thermocouple 10. The sensor layer 15 has a connection portion 15c, a beam 15b, and a sensing portion 15d. The connection portion 15c connects the sensor layer 15 to the substrate 20. For example, the connection portion 15c is in contact with the substrate 20. The beam 15b is connected to the sensing portion 15d, and supports the sensing portion 15d in a state of being separated from the substrate 20. The sensing portion 15d and the beam 15b include the thermocouple 10. The p-type portion 11 has, for example, a positive Seebeck coefficient. The n-type portion 12 has a negative Seebeck coefficient.

The thermopile sensor 1a is configured as, for example, an infrared sensor, and the sensing portion 15d includes, for example, an infrared receiver 15e.

As illustrated in FIGS. 1A and 1B, the thermopile sensor 1a further includes, for example, a signal-processing circuit 30, wiring 31, and an electrode pad 33. When infrared rays are incident on the infrared receiver 15e, the temperature of the infrared receiver 15e increases. At this time, the temperature of the infrared receiver 15e increases by a larger amount as the thermal insulation between the substrate 20 and a member on the substrate 20, which are a heat bath, and the infrared receiver 15e becomes higher. As the temperature of the infrared receiver 15e increases, an electromotive force due to the Seebeck effect is generated in the thermocouple 10. The signal-processing circuit 30 processes the generated electromotive force, and thus the thermopile sensor 1a detects the infrared rays. Depending on the way the signal-processing circuit 30 processes the signal, the thermopile sensor 1a can measure the intensity of infrared rays and/or the temperature of an object. An electric signal processed by the signal-processing circuit 30 can be read out through the electrode pad 33.

The substrate 20 has a recessed portion 25. The recessed portion 25 opens in one of main surfaces of the substrate 20. As illustrated in FIG. 1A, the sensing portion 15d and the beam 15b overlap the recessed portion 25 in a plan view the thermopile sensor 1a. The sensing portion 15d and the beam 15b are spanned over the recessed portion 25.

The substrate 20 is typically made of a semiconductor. The semiconductor is, for example, Si. However, the substrate 20 may be made of a semiconductor other than Si or a material other than a semiconductor.

The material of the wiring 31 is not limited to a specific material. The wiring 31 is made of, for example, an impurity semiconductor, a metal, or a metal compound. The metal and the metal compound may be, for example, materials used in a general semiconductor process, such as Al, Cu, TiN, and TaN.

The signal-processing circuit 30 has, for example, a known configuration that includes a transistor device and that can process an electric signal.

The sensor layer 15 may have a single-layer structure or a multilayer structure. As illustrated in FIG. 1B, the sensor layer 15 is a single layer in which the thermocouple 10 faces the substrate 20. In this case, the material of the sensor layer 15 may be a semiconductor material in which carriers for electrical conduction can be regulated to either of holes or electrons by doping. Examples of such a semiconductor material include Si, SiGe, SiC, GaAs, InAs, InSb, InP, GaN, ZnO, and BiTe. The base material of a semiconductor in the thermocouple 10 is not limited to these examples. The base material of a semiconductor in the thermocouple 10 may be a single crystal material, a polycrystal material, or an amorphous material. In a single crystal material, atoms are orderly arranged over a long distance. The thermocouple 10 includes a thin film having a thickness that is, for example, greater than or equal to 10 nm and less than or equal to 500 nm.

One end of the p-type portion 11 and one end of the n-type portion 12 are electrically connected to each other by, for example, a hot junction 13. The hot junction 13 is made of, for example, a metal film or a metal compound film. Thus, a thermocouple element is constituted by the p-type portion 11, the n-type portion 12, and the hot junction 13. The metal film or the metal compound film that forms the hot junction 13 is not limited to a specific film, and may be, for example, a film of a metal or a metal compound such as TiN, TaN, Al, Ti, or Cu, which is generally used in a semiconductor process. The beam 15b and the sensing portion 15d of the sensor layer 15 may be constituted by the p-type portion 11 and the n-type portion 12, or may include a non-doped portion that is not doped with impurities.

The hot junction 13 may be caused to function as an infrared absorbing layer by matching the sheet resistance of the metal film or the metal compound film that forms the hot junction 13 with the impedance of vacuum. For example, when the hot junction 13 includes TiN, it is possible to match the sheet resistance of the hot junction 13 with the impedance of vacuum by adjusting the thickness of the hot junction 13 to about 10 nm.

As illustrated in FIG. 1A, the wiring 31 and the p-type portion 11 are electrically connected by, for example, the connection portion 15c. The wiring 31 and the n-type portion 12 are electrically connected by, for example, the connection portion 15c. The wiring 31 electrically connects the p-type portion 11 and the signal-processing circuit 30, and the wiring 31 electrically connects the n-type portion 12 and the signal-processing circuit 30.

The boundary scattering frequency of phonons in the first phononic crystal 11c of the p-type portion 11 is higher than that in the other portion, and the first phononic crystal 11c has a thermal conductivity that is lower than the thermal conductivity of the p-type material included in the p-type portion 11. The boundary scattering frequency of phonons in the second phononic crystal 12c of the n-type portion 12 is higher than that in the other portion, and the second phononic crystal 12c has a thermal conductivity that is lower than the thermal conductivity of the n-type material included in the n-type portion 12.

The shape of the holes 10h of the first phononic crystal 11c and the holes 10h of the second phononic crystal 12c is not limited to a specific shape. The shape of the holes 10h may be a circle, or may be a polygon such as a triangle or a quadrangle, in a plan view of the first phononic crystal 11c or the second phononic crystal 12c. The holes 10h may be through-holes extending through the sensor layer 15 or may be non-through-holes. When the holes 10h are through-holes, the thermal conductivity of the p-type portion 11 or the n-type portion 12 tends to be lower. When the holes 10h are non-through-holes, the beam 15b tends to have high strength.

For example, in the first phononic crystal 11c and the second phononic crystal 12c, the arrangement of the holes 10h has periodicity. In other words, the holes 10h are regularly arranged in a plan view of each of the first phononic crystal 11c and the second phononic crystal 12c. The period of the holes 10h is, for example, in the range from 1 nm to 5 μm. The wavelength of phonons that carry heat mainly encompasses a range from 1 nm to 5 μm, and thus the fact that the period of the holes 10h is in the range from 1 nm to 5 μm is advantageous in reducing the thermal conductivity of the first phononic crystal 11c and the second phononic crystal 12c.

Figure 2A:
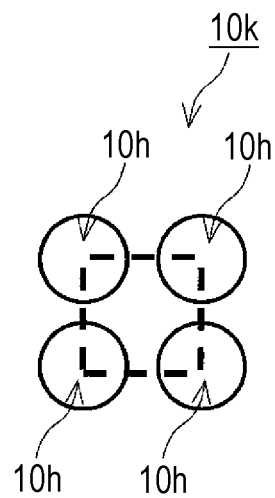
FIG. 2A is plan view illustrating an example of a unit cell of a phononic crystal.
Figure 2B:
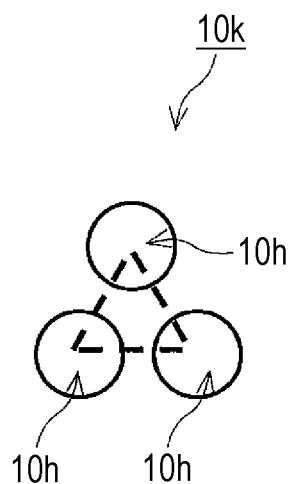
FIG. 2B is plan view illustrating another example of a unit cell of a phononic crystal.
Figure 2C:
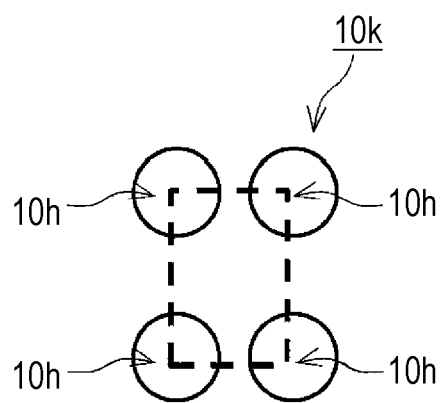
FIG. 2C is a plan view illustrating still another example of a unit cell of a phononic crystal.
Figure 2D:
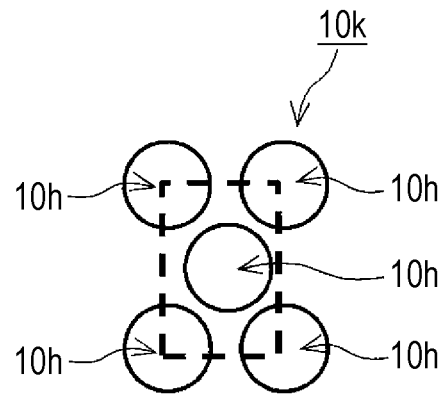
FIG. 2D is plan view illustrating still another example of a unit cell of a phononic crystal.

FIGS. 2A, 2B, 2C, and 2D illustrate examples of a unit cell 10k of a phononic crystal. The unit cell of the first phononic crystal 11c and the second phononic crystal 12c is not limited to a specific unit cell. As illustrated in FIG. 2A, the unit cell 10k may be a tetragonal lattice. As illustrated in FIG. 2B, the unit cell 10k may be a triangular lattice. As illustrated in FIG. 2C, the unit cell 10k may be a rectangular lattice. As illustrated in FIG. 2D, the unit cell 10k may be a face-centered rectangular lattice.

Figure 2E:
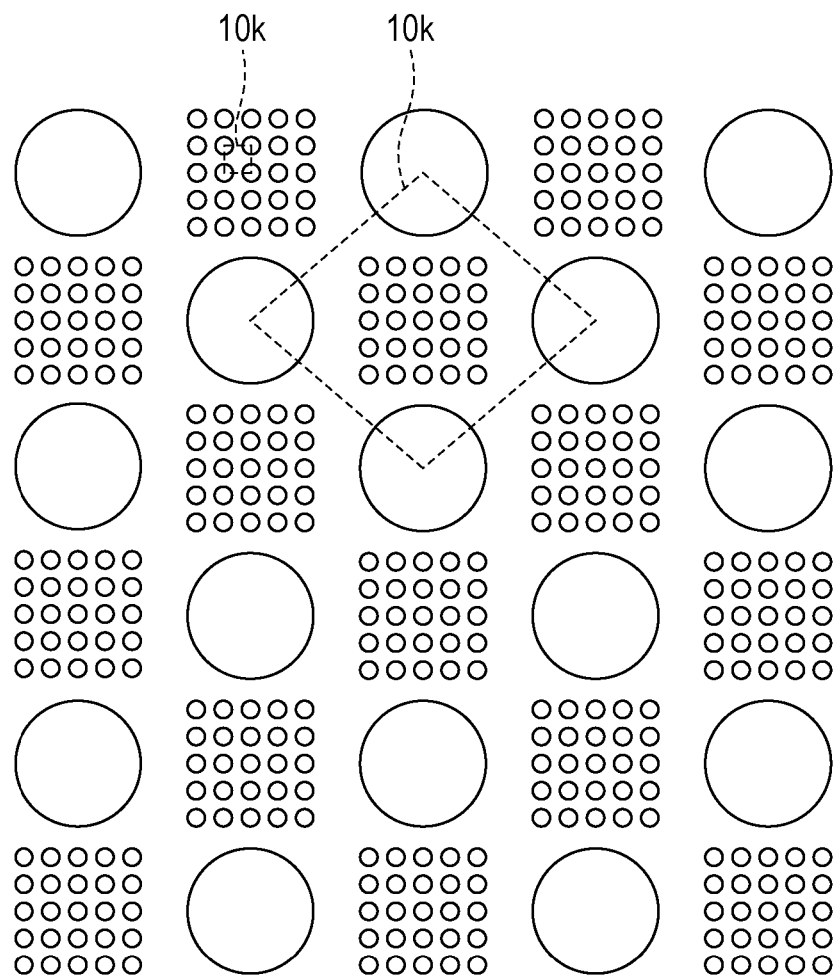
FIG. 2E is a plan view illustrating an example of a phononic crystal.

Each of the first phononic crystal 11c and the second phononic crystal 12c may include unit cells of different types. FIG. 2E illustrates an example of a phononic crystal. As illustrated in FIG. 2E, for example, arrangement patterns of the holes 10h having two different types of unit cells 10k may coexist in the first phononic crystal 11c or the second phononic crystal 12c.

As illustrated in FIG. 1A, each of the first phononic crystal 11c and the second phononic crystal 12c is formed, for example, in the beam 15b. Thus, it is possible to increase thermal insulation between the substrate 20 and the sensing portion 15d, and the thermopile sensor 1a tends to have high sensitivity.

Each of the first phononic crystal 11c and the second phononic crystal 12c is, for example, a single crystal. Each of the first phononic crystal 11c and the second phononic crystal 12c may be a polycrystal. In this case, each of the first phononic crystal 11c and the second phononic crystal 12c has domains, and a phononic crystal in each domain is a single crystal. In other words, a phononic crystal in a polycrystal state is a complex of phononic single crystals. In the domains, the holes 10h are regularly arranged in different directions. In each domain, the orientations of unit cells are the same. In a plan view of each of the first phononic crystal 11c and the second phononic crystal 12c, the shapes of the domains may be the same or may be different. In a plan view of each of the first phononic crystal 11c and the second phononic crystal 12c, the sizes of the domains may be the same or may be different.

When the first phononic crystal 11c or the second phononic crystal 12c is a polycrystal, the shape of each domain in a plan view is not limited to a specific shape. The shape of each domain in a plan view is, for example, a polygon such as a triangle, square, or a rectangle, a circle, an ellipse, or a composite of these shapes. The shape of each domain in a plan view may be an indefinite shape. The number of domains included in the first phononic crystal 11c or the second phononic crystal 12c is not limited to a specific value.

For example, the thermal conductivity of the p-type material included in the p-type portion 11 is different from the thermal conductivity of the n-type material included in the n-type portion 12. In other words, one of the thermal conductivities of the p-type material and the n-type material is higher than the thermal conductivity of the other of the p-type material and the n-type material. The boundary scattering frequency of phonons in the phononic crystal of one of the p-type portion 11 and the n-type portion 12 including a material having a higher thermal conductivity is higher than the boundary scattering frequency of phonons in the phononic crystal of the other of the p-type portion 11 and the n-type portion 12. Alternatively, the ratio of the sum of the areas of the holes 10h to the area of the phononic crystal in a plan view of one of the p-type portion 11 and the n-type portion 12 is greater than that of the other of the p-type portion 11 and the n-type portion 12.

When the thermal conductivity of the p-type material of the p-type portion 11 is higher than the thermal conductivity of the n-type material of the n-type portion 12, the thermopile sensor 1a satisfies, for example, at least one condition selected from a group consisting of the following (Ia) and (IIa). In these conditions, the arrangement of the holes 10h in the first phononic crystal 11c and the second phononic crystal 12c is not limited to a specific form.

(Ia) The boundary scattering frequency of phonons in the first phononic crystal 11c is higher than the boundary scattering frequency of phonons in the second phononic crystal 12c.

(IIa) The ratio R1 is greater than the ratio R2.

The boundary scattering frequency of phonons in a phononic crystal can be regulated, for example, by adjusting at least one selected from a group consisting of (i), (ii), and (iii) described above. When the thermal conductivity of the p-type material of the p-type portion 11 is higher than the thermal conductivity of the n-type material of the n-type portion 12, for example, at least one selected from a group consisting of the following (ia), (iia), and (iiia) is satisfied.

(ia) The shortest distance between the nearest holes 10h in a plan view of the first phononic crystal 11c is shorter than the shortest distance between the nearest holes 10h in a plan view of the second phononic crystal 12c.

(iia) The ratio R1 is greater than the ratio R2.

(iiia) The specific surface area SV1 of the first phononic crystal 11c is greater than the specific surface area SV2 of the second phononic crystal 12c. The specific surface area SV1 is determined by dividing the surface area of the first phononic crystal 11c by the volume of the first phononic crystal 11c. The specific surface area SV2 is determined by dividing the surface area of the second phononic crystal 12c by the volume of the second phononic crystal 12c.

When the thermal conductivity of the n-type material of the n-type portion 12 is higher than the thermal conductivity of the p-type material of the p-type portion 11, the thermopile sensor 1a satisfies, for example, at least one condition selected from a group consisting of the following (Ib) and (IIb). In these conditions, the arrangement of the holes 10h in the first phononic crystal 11c and the second phononic crystal 12c is not limited to a specific form.

(Ib) The boundary scattering frequency of phonons in the second phononic crystal 12c is higher than the boundary scattering frequency of phonons in the first phononic crystal 11c.

(IIb) The ratio R2 is greater than the ratio R1.

When the thermal conductivity of the n-type material of the n-type portion 12 is higher than the thermal conductivity of the p-type material of the p-type portion 11, the thermopile sensor 1a satisfies, for example, at least one selected from a group consisting of the following (ib), (iib), and (iiib).

(ib) The shortest distance between the nearest holes 10h in a plan view of the second phononic crystal 12c is shorter than the shortest distance between the nearest holes 10h in a plan view of the first phononic crystal 11c.

(iia) The ratio R2 is greater than the ratio R1.

(iiia) The specific surface area SV2 of the second phononic crystal 12c is greater than the specific surface area SV1 of the first phononic crystal 11c.

Regarding the conditions (ia) and (ib), it is assumed that the shortest distance between the nearest holes 10h is different from place to place in the first phononic crystal 11c or the second phononic crystal 12c. In this case, for example, the shortest distance between each hole 10h and the nearest hole 10h is determined. Then, the sum of the shortest distances for the holes 10h may be divided by the number of the holes 10h to determine the shortest distance between the nearest holes 10h in a plan view of the first phononic crystal 11c or the second phononic crystal 12c.

Each of FIGS. 2F, 2G, 2H, 2I, 2J, 2K, 2L, 2M, 2N, and 2O illustrates an example of a phononic crystal that forms the first phononic crystal 11c and the second phononic crystal 12c.

Figure 2F:
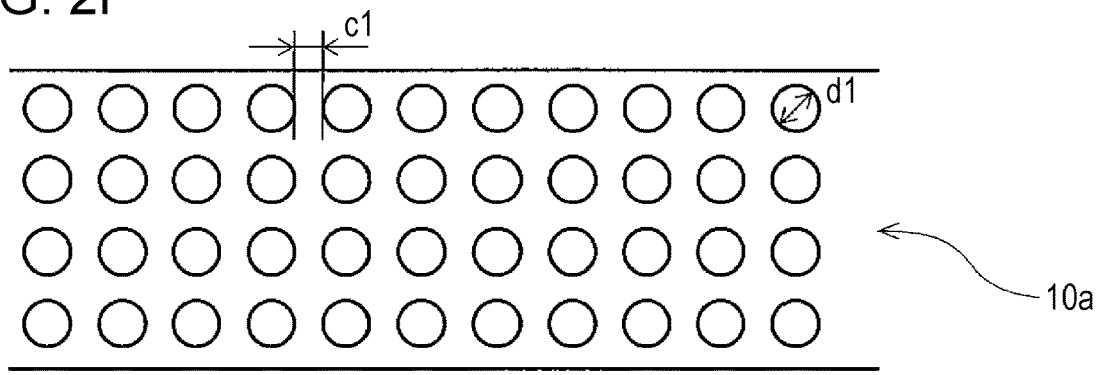
FIG. 2F is a plan view illustrating another example of a phononic crystal.
Figure 2G:
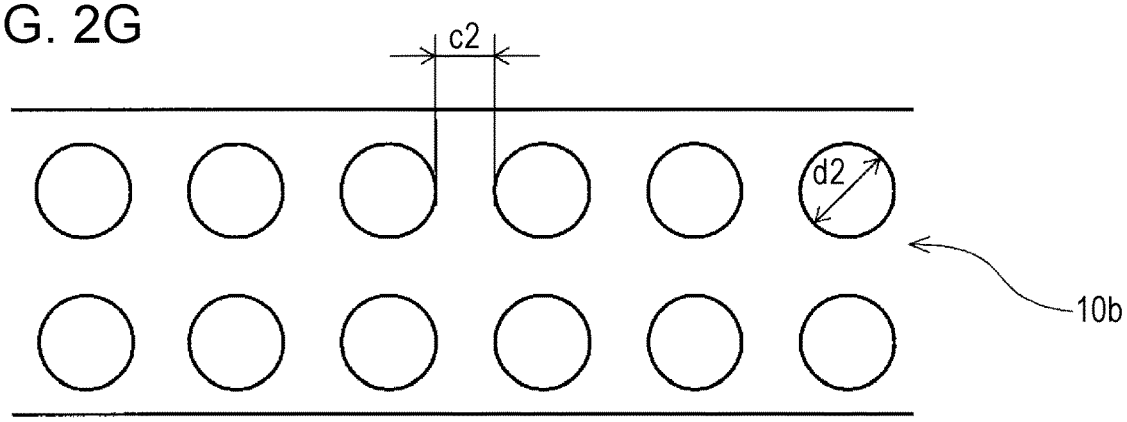
FIG. 2G is a plan view illustrating still another example of a phononic crystal.

One of the first phononic crystal 11c and the second phononic crystal 12c is, for example, a phononic crystal 10a illustrated in FIG. 2F. In addition, the other of the first phononic crystal 11c and the second phononic crystal 12c is, for example, a phononic crystal 10b illustrated in FIG. 2G.

In a plan view of the phononic crystal 10a, the diameter of each hole 10h is d1, and the shortest distance between the nearest holes 10h is c1. In a plan view of the phononic crystal 10b, the diameter of each hole 10h is d2, and the shortest distance between the nearest holes 10h is c2. Although a relationship d1<d2 is satisfied, the quotient of the diameter of each hole 10h divided by the period of the arrangement of the holes 10h is uniform in the phononic crystal 10a and the phononic crystal 10b. Therefore, the ratio of the sum of the areas of holes to the area of the phononic crystal in a plan view is uniform in the phononic crystal 10a and the phononic crystal 10b. On the other hand, because a relationship c1<c2 is satisfied, the boundary scattering frequency of phonons in the phononic crystal 10a is higher than the boundary scattering frequency of phonons in the phononic crystal 10b.

The shortest distance between the nearest holes in a phononic crystal can be regulated by, for example, changing the period of regular arrangement of holes. For example, suppose a case where the base material of the phononic crystal is Si, the ratio of the sum of the areas of holes to the area of the phononic crystal in a plan view is 50%, and the holes are regularly arranged with a period that is less than or equal to 100 nm. In this case, when the period of the arrangement of the holes is changed by 10%, the thermal conductivity of the phononic crystal may change by greater than or equal to 15%. For example, suppose a case where the base material of the phononic crystal is Si, the ratio of the sum of the areas of holes to the area of the phononic crystal in a plan view is 50%, and the holes are regularly arranged with a period that is equal to or less than 50 nm. In this case, when the period of the arrangement of the holes is changed by 5%, the thermal conductivity of the phononic crystal may change by greater than or equal to 10%. Therefore, for example, it is conceivable to regulate the difference between the period of the arrangement of the holes of the phononic crystal of the p-type portion and the period of the arrangement of the holes of the phononic crystal of the n-type portion n-type portion to about 5%. In this case, the difference between the thermal conductivity of the phononic crystal of the p-type portion and the thermal conductivity of the phononic crystal of the n-type portion can be sufficiently reduced, and the risk of breakage of a member such as the thermocouple can be reduced in the thermopile sensor. As the ratio of the sum of the areas of holes to the area of a phononic crystal in a plan view becomes larger, the thermal conductivity of the phononic crystal may change by a larger amount due to a slight change in the period of the arrangement of the holes.

Figure 2H:
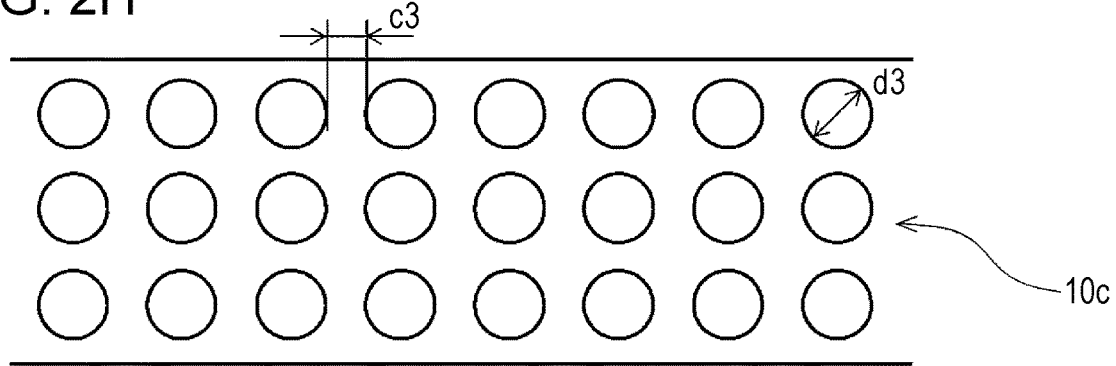
FIG. 2H is a plan view illustrating still another example of a phononic crystal.
Figure 2I:
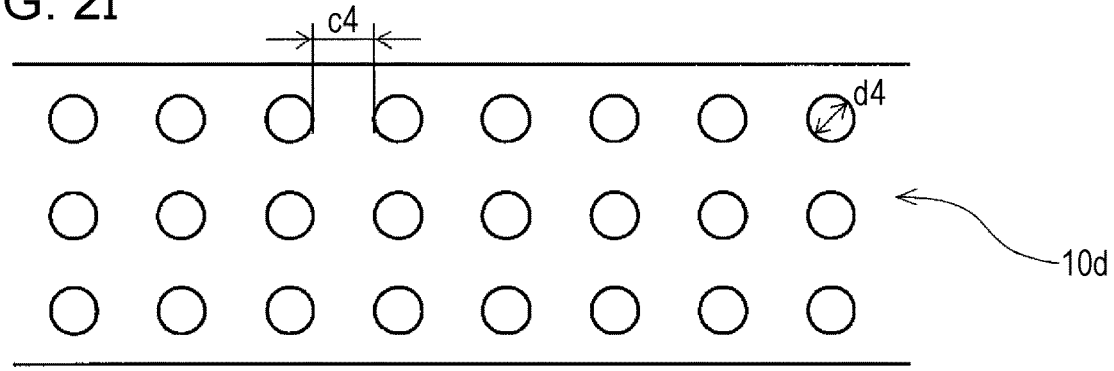
FIG. 2I is a plan view illustrating still another example of a phononic crystal.

One of the first phononic crystal 11c and the second phononic crystal 12c may be a phononic crystal 10c illustrated in FIG. 2H. In addition, the other of the first phononic crystal 11c and the second phononic crystal 12c may be a phononic crystal 10d illustrated in FIG. 2I.

In a plan view of the phononic crystal 10c, the diameter of each hole 10h is d3, and the shortest distance between the nearest holes 10h is c3. In a plan view of the phononic crystal 10d, the diameter of each hole 10h is d4, and the shortest distance between the nearest holes 10h is c4. The period of the arrangement of the holes 10h is uniform in the phononic crystal 10c and the phononic crystal 10d. On the other hand, in the phononic crystal 10c and the phononic crystal 10d, relationships d3>d4 and c3<c4 are satisfied. The shortest distance between the nearest holes 10h, the ratio of the sum of the areas of the holes 10h to the area of the phononic crystal in a plan view, and the quotient of the sum of the circumferences of the holes 10h in a plan view of the phononic crystal divided by the area of the phononic crystal are considered. Considering these matters, the boundary scattering frequency of phonons in the phononic crystal 10c is higher than the boundary scattering frequency of phonons in the phononic crystal 10d.

For example, suppose a case where the base material of a phononic crystal is Si, the holes are regularly arranged with a period of 300 nm, and the ratio of the sum of the areas of holes to the area of the phononic crystal in a plan view exceeds 19%. In this case, when the ratio of the sum of the areas of holes to the area of the phononic crystal in a plan view is changed by 2%, the thermal conductivity of the phononic crystal may change by greater than or equal to 10%. Therefore, for example, it is conceivable to regulate the difference between the ratio of the sum of the areas of holes to the area of the phononic crystal of the p-type portion in a plan view and the ratio of the sum of the areas of holes to the area of the phononic crystal of the n-type portion in a plan view to about 2%. In this case, the difference between the thermal conductivity of the p-type portion and the thermal conductivity of the n-type portion can be sufficiently reduced, and the risk of breakage of a member such as the thermocouple can be reduced in the thermopile sensor. As the period of the arrangement of holes in a phononic crystal becomes smaller, the thermal conductivity of the phononic crystal may change by a larger amount due to a slight change in the ratio of the sum of the areas of the holes to the area of the phononic crystal in a plan view.

Figure 2J:
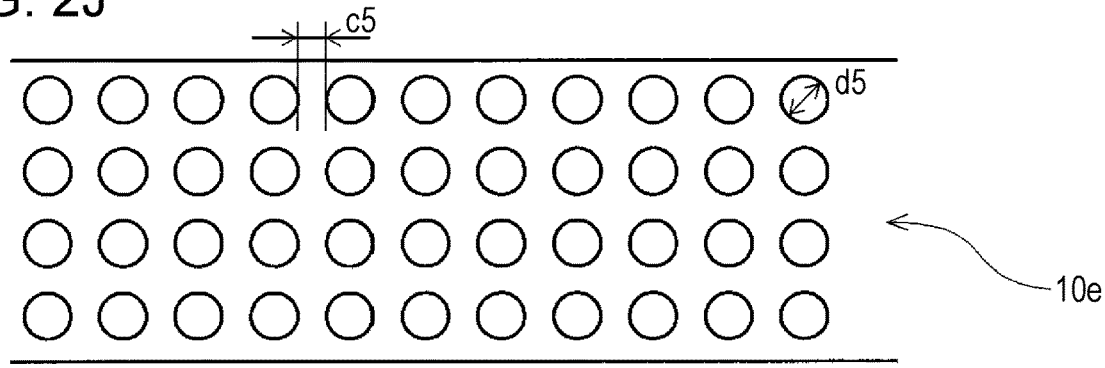
FIG. 2J is a plan view illustrating still another example of a phononic crystal.
Figure 2K:
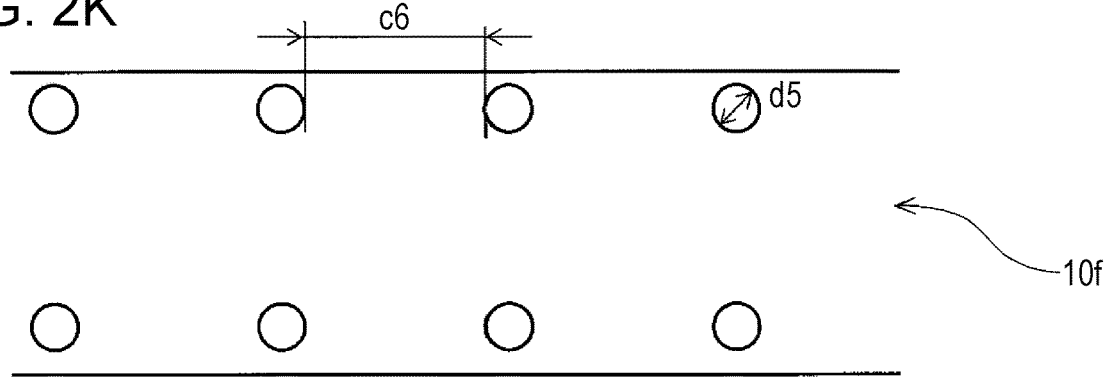
FIG. 2K is a plan view illustrating still another example of a phononic crystal.

One of the first phononic crystal 11c and the second phononic crystal 12c may be a phononic crystal 10e illustrated in FIG. 2J. In addition, the other of the first phononic crystal 11c and the second phononic crystal 12c may be a phononic crystal 10f illustrated in FIG. 2K.

In a plan view the phononic crystal 10e, the diameter of each hole 10h is d5, and the shortest distance between the nearest holes 10h is c5. In a plan view of the phononic crystal 10f, the diameter of each hole 10h is d5, and the shortest distance between the nearest holes 10h is c6. The diameter of each hole 10h is uniform in a plan view of the phononic crystal 10e and the phononic crystal 10f. On the other hand, a relationship c5<c6 is satisfied. The shortest distance between the nearest holes 10h, the ratio of the sum of the areas of the holes 10h to the area of the phononic crystal in a plan view, and the quotient of the sum of the circumference of the holes 10h in a plan view of the phononic crystal divided by the area of the phononic crystal are considered. Considering these matters, the boundary scattering frequency of phonons in the phononic crystal 10e is higher than the boundary scattering frequency of phonons in the phononic crystal 10f.

Figure 2L:
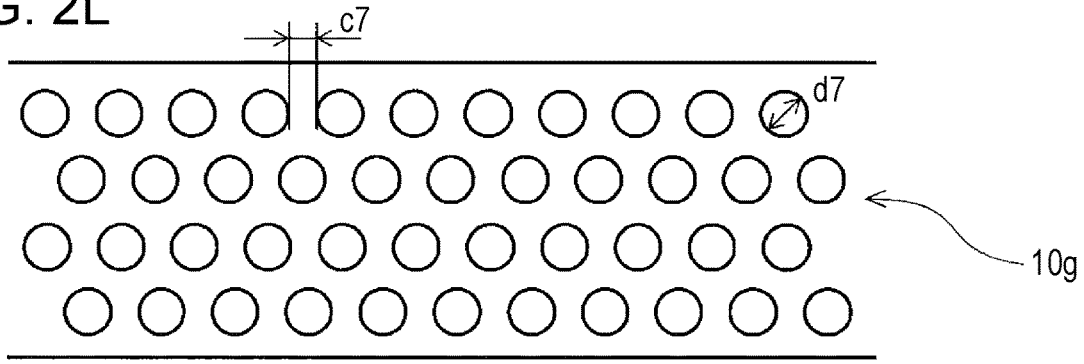
FIG. 2L is a plan view illustrating still another example of a phononic crystal.
Figure 2M:
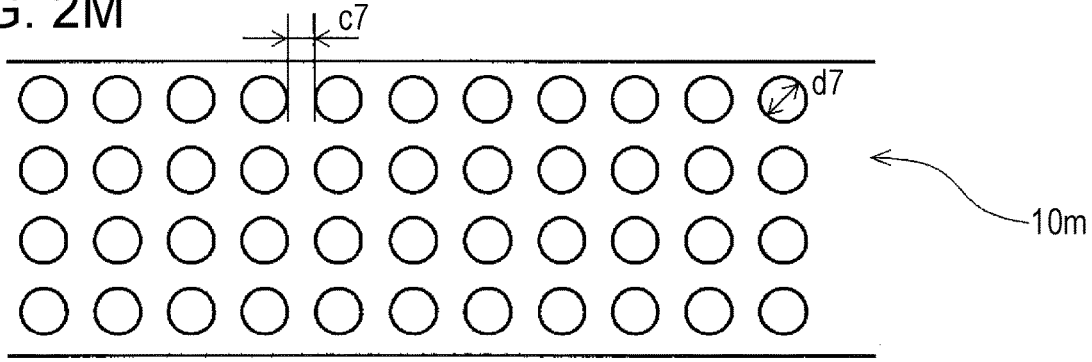
FIG. 2M is a plan view illustrating still another example of a phononic crystal.

One of the first phononic crystal 11c and the second phononic crystal 12c may have a phononic crystal 10g illustrated in FIG. 2L. In addition, the other of the first phononic crystal 11c and the second phononic crystal 12c may have a phononic crystal 10m illustrated in FIG. 2M.

In a plan view of the phononic crystal 10g and the phononic crystal 10m, the diameter of each hole 10h is d7, and the shortest distance between the nearest holes 10h is c7. The unit cell of the arrangement of the holes 10h is a triangular lattice in a plan view of the phononic crystal 10g, and the unit cell of the arrangement of the holes 10h in a plan view the phononic crystal 10m is a tetragonal lattice. The filling factor of a triangular lattice is higher than the filling factor of a tetragonal lattice. The ratio of the sum of the areas of the holes 10h to the area of the phononic crystal in a plan view, and the quotient of the sum of the circumferences of the holes 10h in a plan view of the phononic crystal divided by the area of the first phononic crystal are considered. Considering these matters, the boundary scattering frequency of phonons in the phononic crystal 10g is higher than the boundary scattering frequency of phonons in the phononic crystal 10m.

Figure 2N:
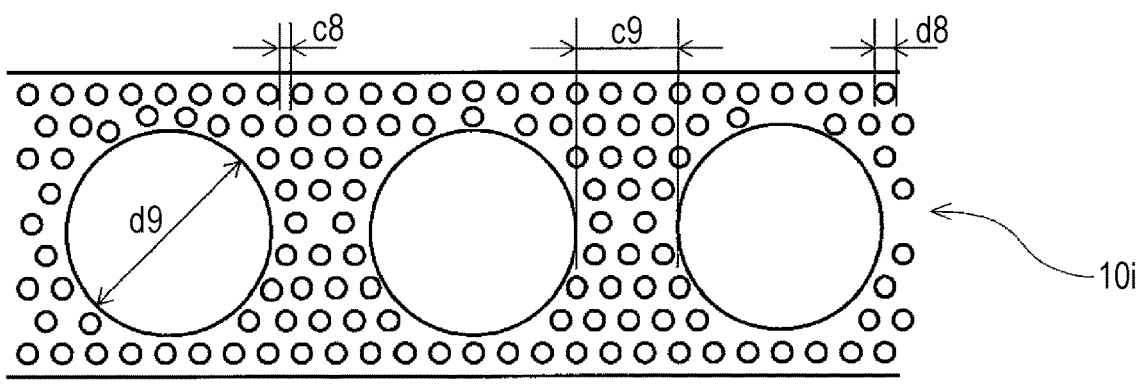
FIG. 2N is a plan view illustrating still another example of a phononic crystal.

One of the first phononic crystal 11c and the second phononic crystal 12c may have a phononic crystal 10i illustrated in FIG. 2N. In addition, the other of the first phononic crystal 11c and the second phononic crystal 12c may have a phononic crystal 10j illustrated in FIG. 2O.

Each of the phononic crystal 10i and the phononic crystal 10j has multiple types of arrangement patterns, regarding the arrangement of the holes 10h. In a plan view, the phononic crystal 10i has an arrangement pattern of the holes 10h such that the diameter of each hole 10h is d8 and the shortest distance between the nearest holes 10h is c8. In addition, in a plan view, the phononic crystal 10i has an arrangement pattern of the holes 10h such that the diameter of each hole 10h is d9 and the shortest distance between the nearest holes 10h is c9. In a plan view, the phononic crystal 10j has an arrangement pattern of the holes 10h such that the diameter of each hole 10h is d8 and the shortest distance between the nearest holes 10h is c8. In addition, in a plan view, the phononic crystal 10j has an arrangement pattern of the holes 10h such that the diameter of each hole 10h is d10 and the shortest distance between the nearest holes 10h is c10. A relationship d9>d10 is satisfied. Considering the ratio of the sum of the areas of the holes 10h to the area of the phononic crystal in a plan view, the boundary scattering frequency of phonons in the phononic crystal 10i is higher than the boundary scattering frequency of phonons in the phononic crystal 10j.

The difference between the thermal conductivity of the first phononic crystal 11c and the thermal conductivity of the second phononic crystal 12c is not limited to a specific value. The difference is, for example, less than or equal to 10% of the lower one of the thermal conductivity of the first phononic crystal 11c and the thermal conductivity of the second phononic crystal 12c. Thus, the temperature of the thermocouple 10 tends to be maintained uniform, and the risk of breakage of a member due to a thermal stress in the thermopile sensor 1a can be reduced. The difference between the thermal conductivity of the first phononic crystal 11c and the thermal conductivity of the second phononic crystal 12c may be greater than or equal to 10% of the lower one of these thermal conductivities. It can be understood that it is effective that the difference between the thermal conductivity of the first phononic crystal 11c and the thermal conductivity of the second phononic crystal 12c is less than the difference between the thermal conductivity of the p-type material included in the p-type portion 11 and the thermal conductivity of the n-type material included in the n-type portion 12.

The difference between the thermal conductivity of the first phononic crystal 11c and the thermal conductivity of the second phononic crystal 12c is, for example, less than or equal to 5 W/(m·K), may be less than or equal to 1 W/(m·K), or may be less than or equal to 0.5 W/(m·K).

The thermopile sensor 1a can be modified from various viewpoints. Each of FIGS. 3A, 3B, 3C, 3D, 3E, and 3F illustrates a modification of the thermopile sensor 1a. Except for portions that will be specifically described, these modifications are configured in the same way as the thermopile sensor 1a. Elements that are the same as or in correspondence with those of the thermopile sensor 1a will be denoted by the same numerals, and descriptions of such elements will be omitted. Descriptions of the thermopile sensor 1a also apply to these modifications, unless technologically contradictory.

Figure 3A:
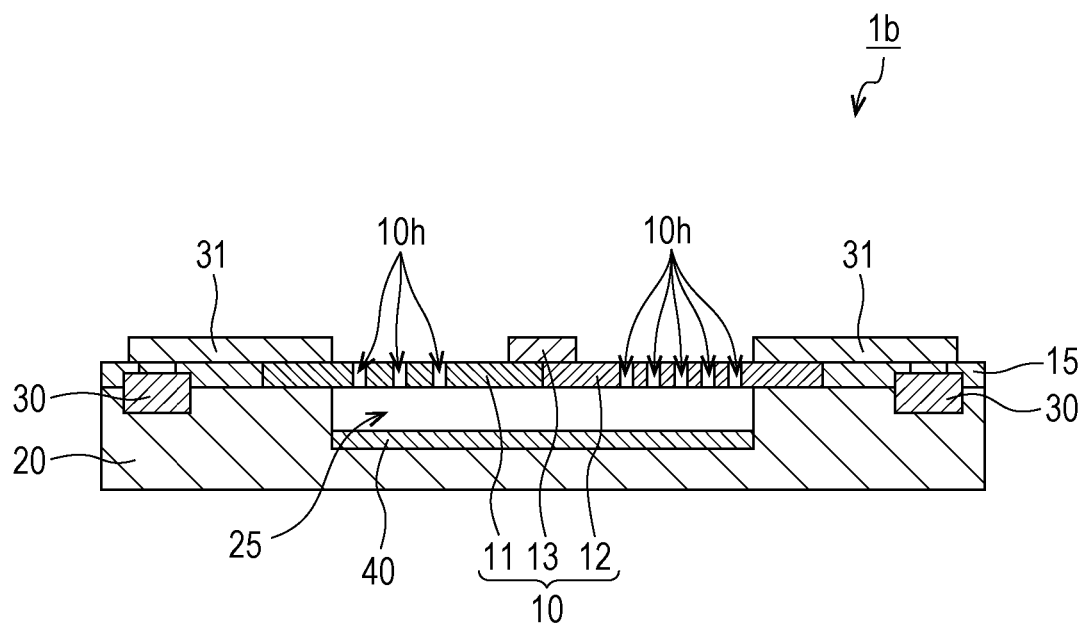
FIG. 3A is a sectional view illustrating a modification of the thermopile sensor according to the first embodiment.

As illustrated in FIG. 3A, a thermopile sensor 1b includes, for example, an infrared reflection layer 40. The infrared reflection layer 40 is disposed on the bottom surface of the recessed portion 25. Thus, the thermopile sensor 1b tends to have high sensitivity to infrared rays. The material of the infrared reflection layer 40 is not limited to a specific material. The material may be a metal such as Al, Cu, W, or Ti, may be a metal compound such as TiN or TaN, or may be highly-conductive Si.

Figure 3B:
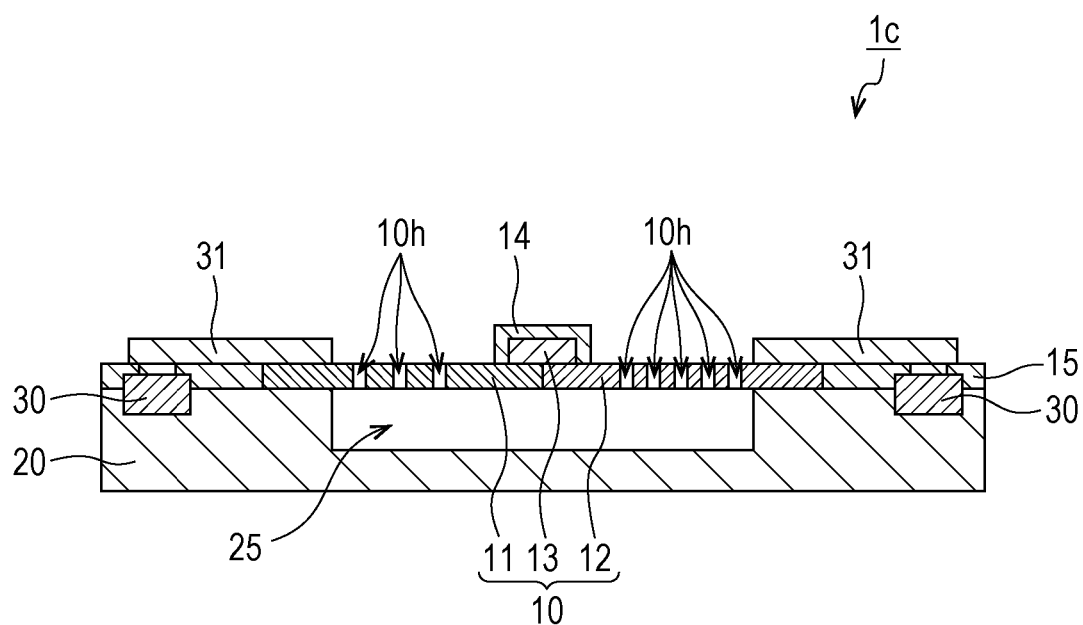
FIG. 3B is a sectional view illustrating another modification of the thermopile sensor according to the first embodiment.

As illustrated in FIG. 3B, a thermopile sensor 1c includes, for example, an infrared absorbing layer 14. The infrared absorbing layer 14 is disposed, for example, on the hot junction 13. Thus, the thermopile sensor 1c tends to have higher sensitivity to infrared rays. The configuration of the infrared absorbing layer 14 is not limited to a specific configuration. The infrared absorbing layer 14 may be a film made of a material such as TaN, Cr, or Ti, a porous metal film, or may be a dielectric film made of $SiO_2$ or the like.

Figure 3C:
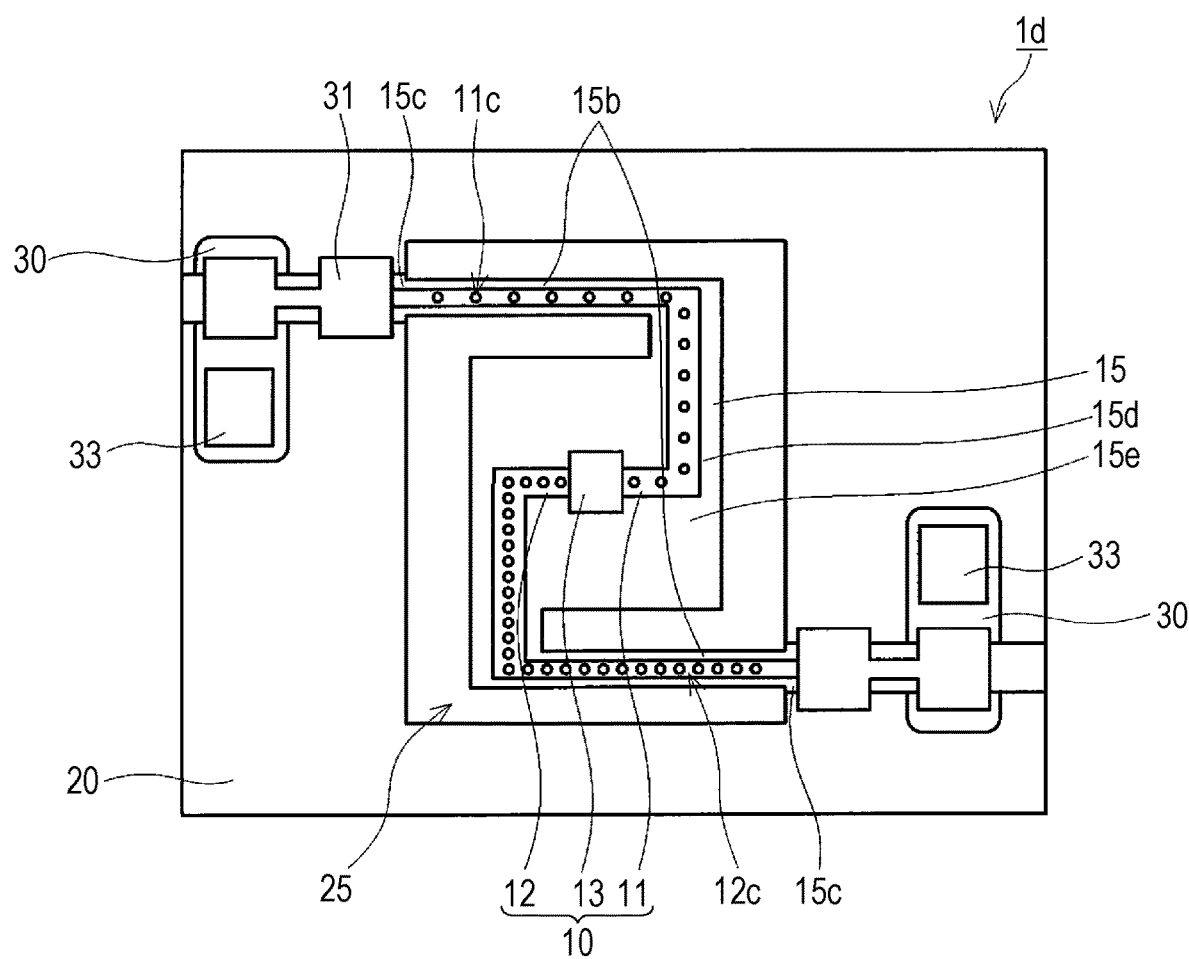
FIG. 3C is a sectional view illustrating still another modification of the thermopile sensor according to the first embodiment.

As illustrated in FIG. 3C, in a thermopile sensor 1d, each of the first phononic crystal 11c and the second phononic crystal 12c is also formed in the sensing portion 15d in addition to the beam 15b. In this case, thermal insulation between the substrate 20 and the sensing portion 15d can be further increased.

Figure 3D:
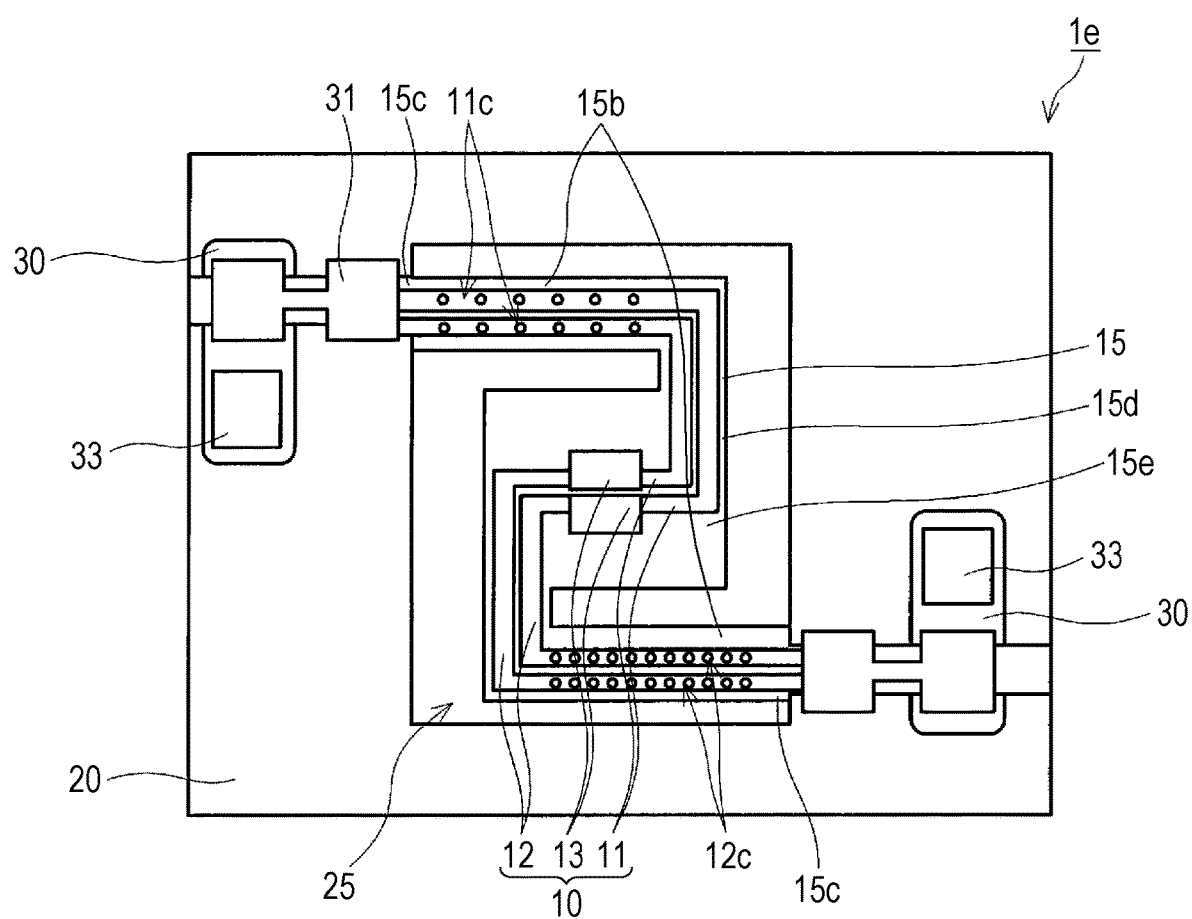
FIG. 3D is a sectional view illustrating still another modification of the thermopile sensor according to the first embodiment.
Figure 3E:
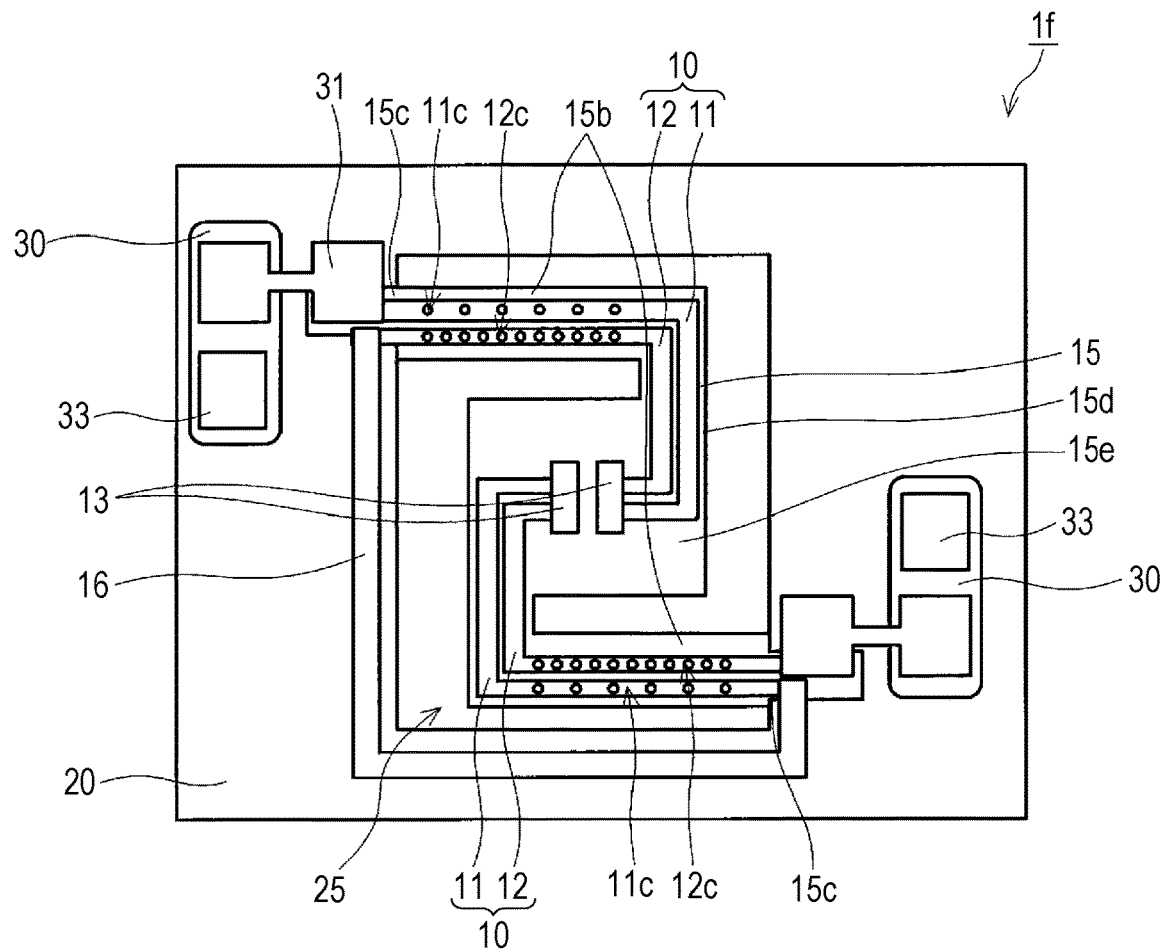
FIG. 3E is a sectional view illustrating still another modification of the thermopile sensor according to the first embodiment.

As illustrated in FIGS. 3D and 3E, thermopile sensors 1e and 1f each include multiple thermocouples 10.

In the thermopile sensor 1e, the thermocouples 10 are arranged in parallel. In this case, even if one or more of the thermocouples 10 malfunction, sensing can be performed by using the other thermocouples 10.

In the thermopile sensor 1f, the thermocouples 10 are arranged in series. In this case, the thermopile sensor 1f tends to have high sensitivity, because output power corresponding to the sum of thermoelectromotive forces generated by the thermocouples 10 can be obtained. As illustrated in FIG. 3E, the thermopile sensor 1f includes a cold junction 16. The cold junction 16 is connected to the connection portion 15c and electrically connects the thermocouples 10. The cold junction 16 includes, for example, a metal film. As illustrated in FIG. 3E, in the thermopile sensor 1f, the p-type portion 11 and the n-type portion 12 are formed in the same beam 15b. Therefore, the first phononic crystal 11c and the second phononic crystal 12c are formed in the same beam 15b.

Figure 3F:
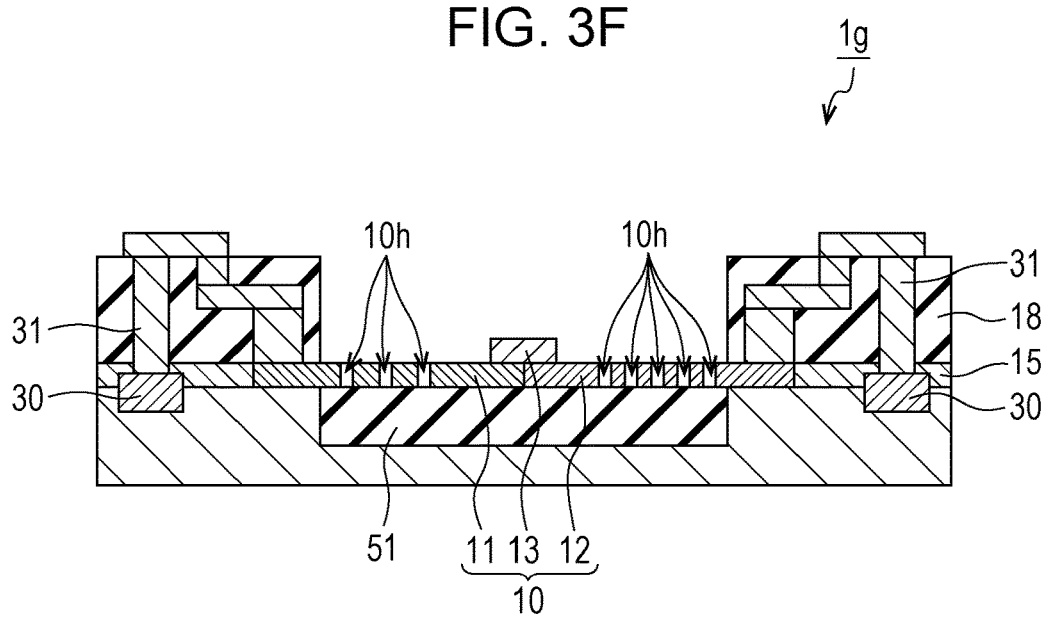
FIG. 3F is a sectional view illustrating still another modification of the thermopile sensor according to the first embodiment.

As illustrated in FIG. 3F, a thermopile sensor 1g includes an insulating film 18. Thus, multilayered wiring layers can be formed, and an electromotive force generated in the thermocouple 10 can be efficiently transmitted to the signal-processing circuit 30.

An example of a method of manufacturing the thermopile sensor 1a will be described. A method of manufacturing the thermopile sensor 1a is not limited to the following method.

Figure 4A:
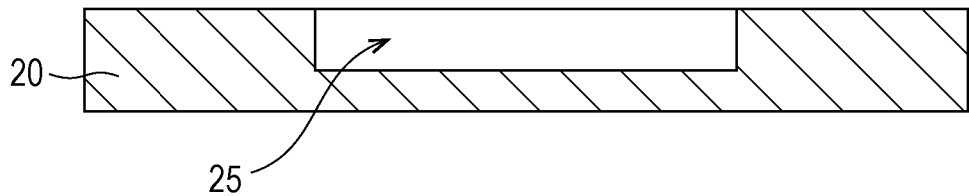
FIG. 4A is a sectional view illustrating a method of manufacturing the thermopile sensor according to the first embodiment.
Figure 4B:
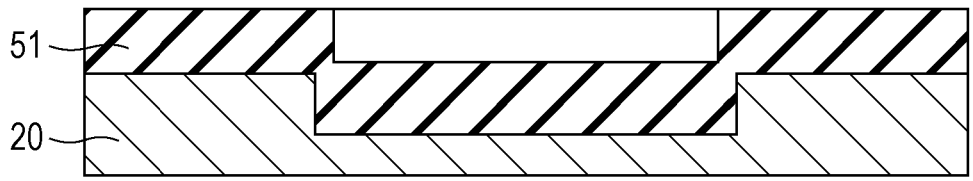
FIG. 4B is a sectional view illustrating the method of manufacturing the thermopile sensor according to the first embodiment.
Figure 4C:
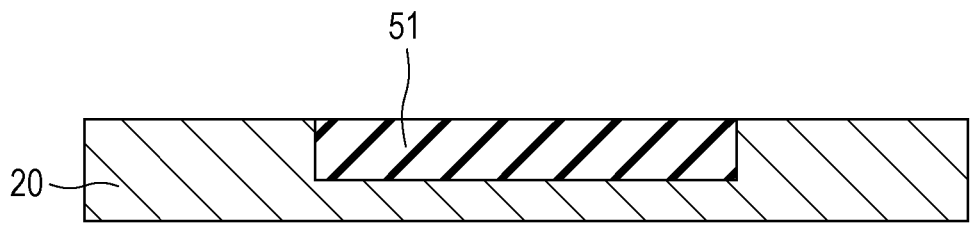
FIG. 4C is a sectional view illustrating the method of manufacturing the thermopile sensor according to the first embodiment.
Figure 4D:
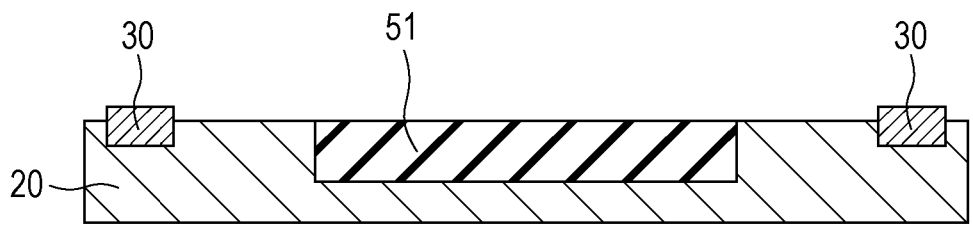
FIG. 4D is a sectional view illustrating the method of manufacturing the thermopile sensor according to the first embodiment.
Figure 4E:
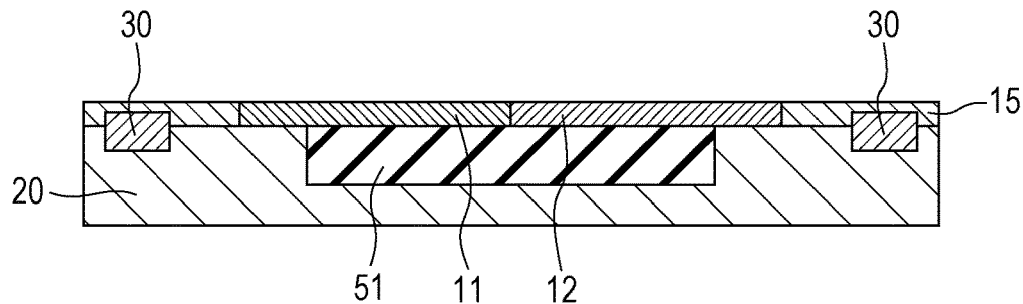
FIG. 4E is a sectional view illustrating the method of manufacturing the thermopile sensor according to the first embodiment.

As illustrated in FIG. 4A, the recessed portion 25, having a depth of about 1 μm, is formed in one of main surfaces of the substrate 20 by photolithography and etching. The substrate 20 is, for example, a Si substrate. Next, as illustrated in FIG. 4B, a sacrificial layer 51 including a material, such as $SiO_2$, different from the material of the substrate 20 is formed in such a way as to cover the recessed portion 25. Next, as illustrated in FIG. 4C, the sacrificial layer 51 outside of the recessed portion 25 is removed by using a method such as chemical mechanical polishing (CMP). Next, as illustrated in FIG. 4D, the signal-processing circuit 30, including a transistor device, is formed in a region of the substrate 20 from which the sacrificial layer 51 has been removed. Subsequently, as illustrated in FIG. 4E, the sensor layer 15, including a semiconductor such as polycrystal Si, is formed by using a method such as chemical vapor deposition (CVD), and doping is performed on a predetermined region of the sensor layer 15, thereby forming the p-type portion 11 and the n-type portion 12. The doping is performed, for example, by using a method such as ion implantation.

Figure 4F:
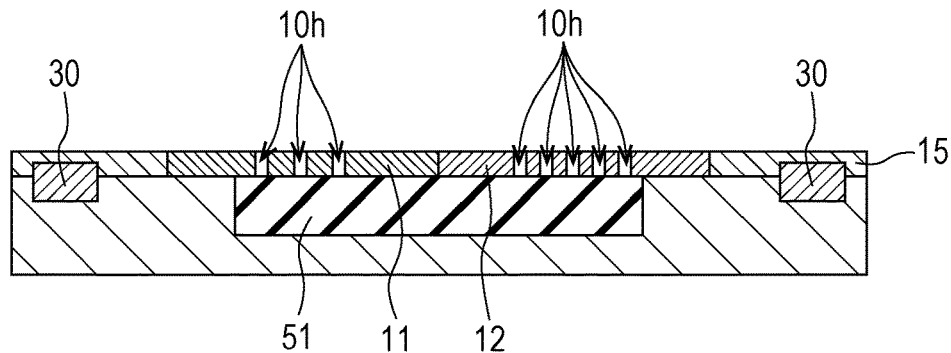
FIG. 4F is a sectional view illustrating the method of manufacturing the thermopile sensor according to the first embodiment.

Next, as illustrated in FIG. 4F, a phononic crystal is formed in each of the p-type portion 11 and the n-type portion 12 of the sensor layer 15. In accordance with the shape of the holes, multiple lithographic technologies are used to form the phononic crystal. For example, photolithography is used to form a phononic crystal having a period that is greater than or equal to 300 nm. Electron-beam lithography is used to form a phononic crystal having a period that is in the range from 100 nm to 300 nm. Block copolymer lithography is used to form a phononic crystal having a period that is in the range from 1 nm to 100 nm. A method of forming the phononic crystal is not limited to these methods. The phononic crystal may be formed by using another lithographic technology such as nanoimprinting lithography. Whichever of the lithographic technologies is used, the phononic crystal can be formed in an arbitrary region of the sensor layer 15.

Figure 2O:
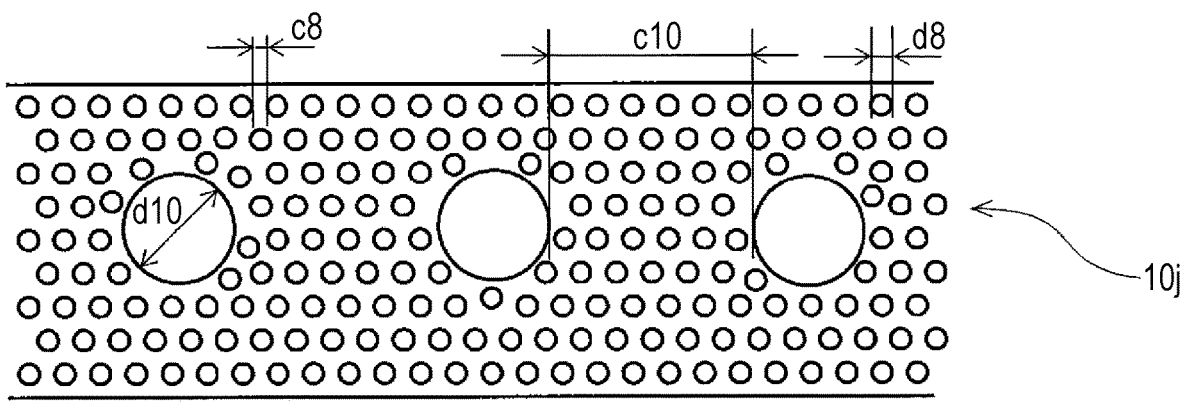
FIG. 2O is a plan view illustrating still another example of a phononic crystal.

A phononic crystal including multiple types unit cells 10k illustrated in FIGS. 2E, 2N, and 2O can be formed by forming beforehand a drawing pattern, corresponding to the unit cells, by photolithography or electron-beam lithography. The phononic crystal including multiple types of unit cells may be formed by using a combination of multiple types of lithographic technologies. For example, unit cells having a small period are formed on a desirable region by block copolymer lithography or electron-beam lithography. Subsequently, unit cells having a large period are overlappingly formed on the same region by photolithography.

When a phononic crystal is to be formed by photolithography, a photomask in which holes having different diameters, different periods, or different unit cells is prepared. A pattern for forming the first phononic crystal 11c may be formed on a photomask that is the same as a photomask for forming the second phononic crystal 12c or may be formed on another photomask. Through exposure and development processes, patterns of the first phononic crystal 11c and the second phononic crystal 12c drawn on the photomask are transferred to a resist film applied onto the sensor layer 15. Subsequently, by etching the sensor layer 15 from the upper surface of the resist film, the holes 10h are formed in the first phononic crystal 11c and the second phononic crystal 12c. Lastly, the holes 10h in the first phononic crystal 11c and the second phononic crystal 12c are obtained by removing the resist film.

A case where a phononic crystal is to be formed by electron-beam lithography will be described. A pattern of holes having different diameters, different periods, or different unit cells in a region corresponding to the first phononic crystal 11c and a region corresponding to the second phononic crystal 12c is input to an electron-beam irradiation apparatus. The sensor layer 15 is irradiated with an electron beam that is scanned in accordance with the input data. Thus, patterns of the first phononic crystal 11c and the second phononic crystal 12c are directly drawn on a resist film applied onto the sensor layer 15. After the drawn patterns have been developed, the sensor layer 15 is etched from the upper surface of the resist film to which the pattern has been transferred. Thus, the holes 10h in the first phononic crystal 11c and the second phononic crystal 12c are formed. Lastly, the holes 10h in the first phononic crystal 11c and the second phononic crystal 12c are obtained by removing the resist film.

When a phononic crystal is to be formed by block copolymer lithography, for example, block copolymers having different compositions are used to form the first phononic crystal 11c and the second phononic crystal 12c. The period of and the arrangement pattern of the self-organized structure in a block copolymer changes in accordance with the type of the block copolymer or the composition ratio of polymers in the block copolymer. Therefore, by using two types of block copolymers having different compositions, it is possible to form two types of phononic crystals whose diameters, periods, or unit cells are different. First, by using a first block copolymer, the first phononic crystal 11c is formed by block copolymer lithography. Subsequently, by using a second block copolymer, the second phononic crystal 12c is formed by block copolymer lithography. Known process conditions can be used for the block copolymer lithography.

Figure 4G:
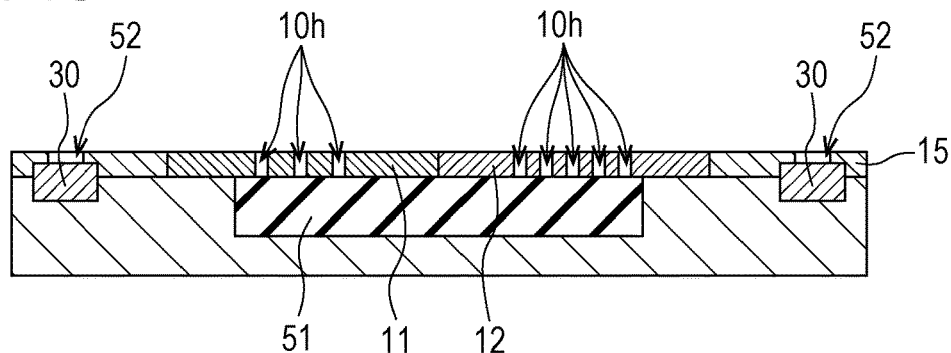
FIG. 4G is a sectional view illustrating the method of manufacturing the thermopile sensor according to the first embodiment.
Figure 4H:
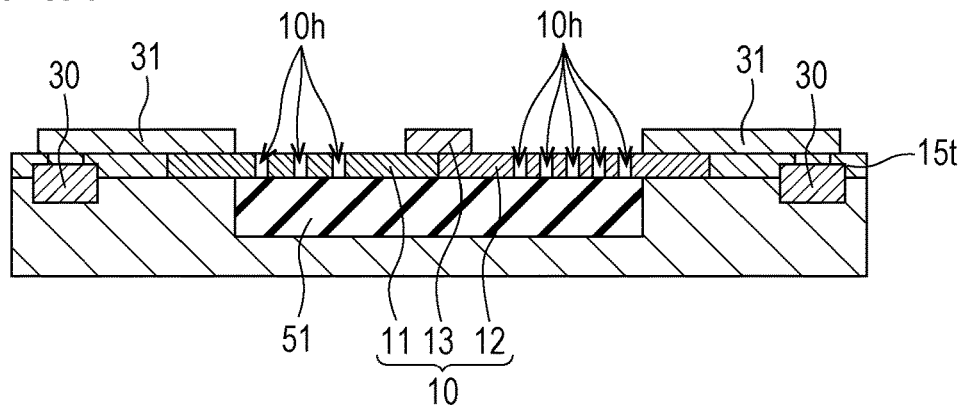
FIG. 4H is a sectional view illustrating the method of manufacturing the thermopile sensor according to the first embodiment.

As illustrated in FIG. 4G, after the first phononic crystal 11c and the second phononic crystal 12c have been formed, the sensing portion 15d and the beam 15b are formed in the sensor layer 15 by photolithography and etching. At this time, a contact hole 52 is also formed. Next, as illustrated in FIG. 4H, a film including a material such as TiN, TaN, Al, Cr, Ti, or Cu is formed on the sensor layer 15. By etching the film, the hot junction 13, the wiring 31, and the electrode pad 33 are formed.

In order to reduce the electrical resistance of the wiring 31, the material of the hot junction 13 and the material of the wiring 31 may be made different from each other. The thickness of a film for the wiring 31 may be made greater than the thickness of a film for the hot junction 13. The material of the wiring 31 may be a metal having a low electrical resistance, such as Al or Cu. In this case, the thickness of the wiring 31 is, for example, in the range from 100 nm to 500 nm. The thermocouple 10 is constituted by the p-type portion 11, the n-type portion 12, the hot junction 13, and the wiring 31 formed in the sensor layer 15.

Lastly, by removing the sacrificial layer 51 by selective etching, the recessed portion 25 is formed in the substrate 20. Thus, the beam 15b and the sensing portion 15d in the sensor layer 15 are spanned in a state of being separated from the substrate 20. Alternatively, the sensing portion 15d may be spanned in a state of being separated from the substrate 20 by removing a part of the substrate 20 by anisotropic etching. In this case, the step of forming the recessed portion 25 in the substrate 20 can be omitted.

In a case where the thermopile sensor 1g is to be manufactured, the insulating film 18 is formed on the uppermost layer in a state illustrated in FIG. 4G. In this case, it is possible to expose the beam 15b and the sensing portion 15d of the sensor layer 15 by removing a region of the insulating film 18 that overlaps the beam 15b and the sensing portion 15d of the sensor layer 15 by photolithography and etching.

Second Embodiment

Figure 5A:
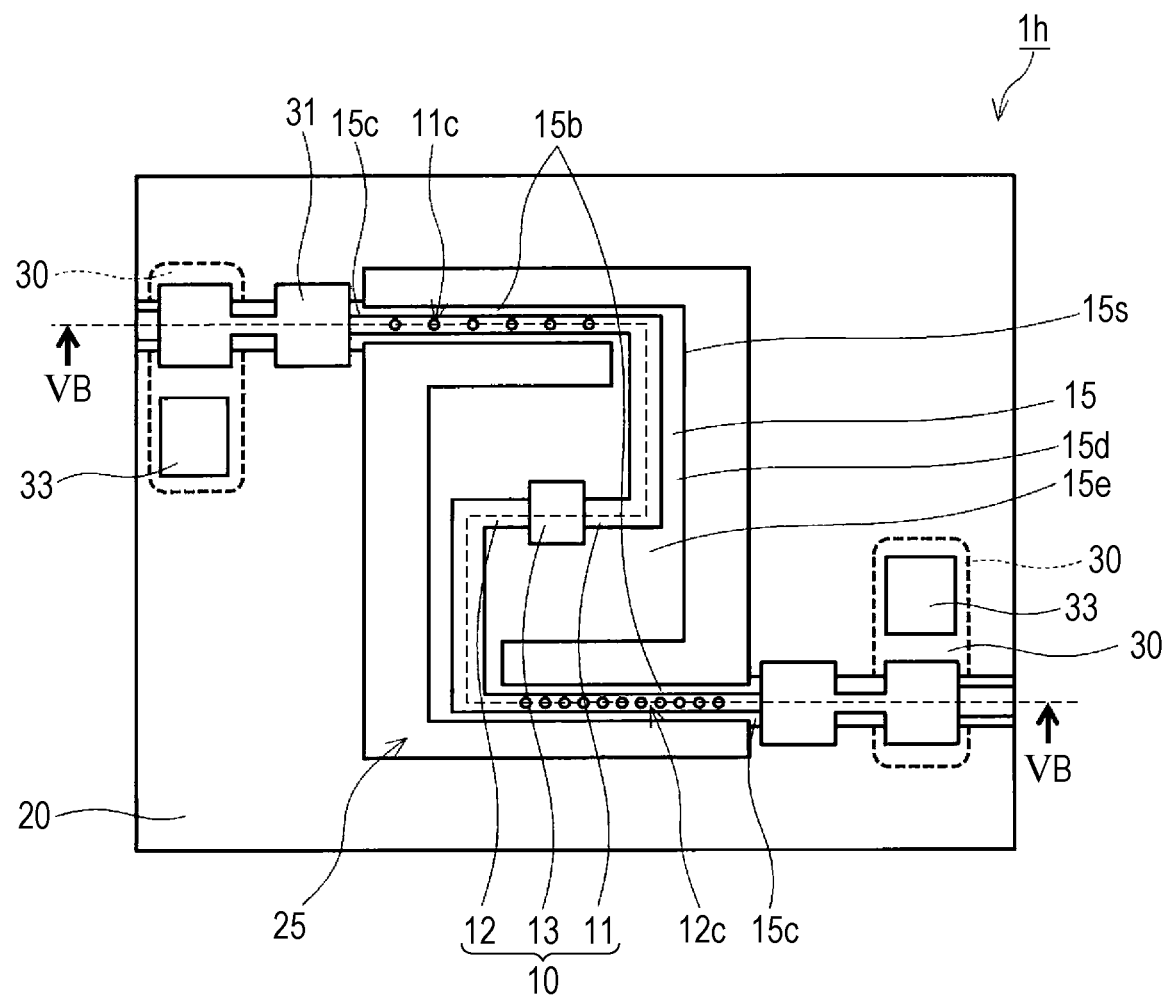
FIG. 5A is a plan view schematically illustrating a thermopile sensor according to a second embodiment.
Figure 5B:
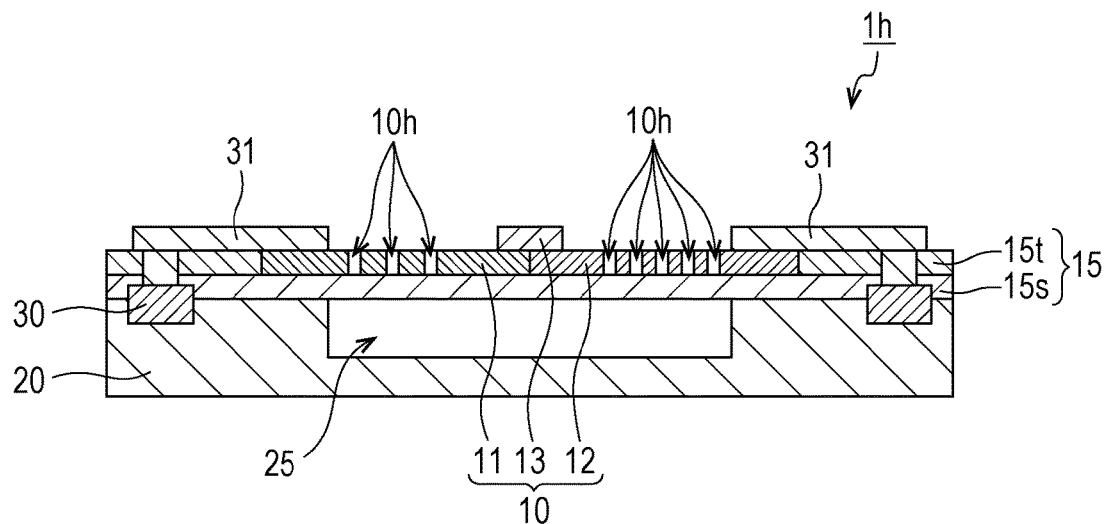
FIG. 5B is a sectional view of the thermopile sensor of FIG. 5A taken along line VB-VB.

FIGS. 5A and 5B illustrate a thermopile sensor 1h according to a second embodiment. Except for portions that will be specifically described, the thermopile sensor 1h is configured in the same way as the thermopile sensor 1a. Elements of the thermopile sensor 1h that are the same as or in correspondence with those of the thermopile sensor 1a will be denoted by the same numerals, and descriptions of such elements will be omitted. Descriptions of the thermopile sensor 1a also apply to the thermopile sensor 1h, unless technologically contradictory.

As illustrated in FIGS. 5A and 5B, the sensor layer 15 of the thermopile sensor 1h has a support layer 15s. The thermocouple 10 is disposed on the support layer 15s. The sensor layer 15 includes, for example, a thermocouple layer 151 including the p-type portion 11 and the n-type portion 12. The thermocouple layer 151 is disposed on the support layer 15s. The strength of a structure in which the beam 15b and the sensing portion 15d are spanned tends to be high due to the support layer 15s. In addition, a stress generated in the thermocouple 10 can be regulated due to the support layer 15s.

The thickness of the support layer 15s is not limited to a specific value. The thickness is, for example, greater than or equal to 10 nm and less than or equal to 500 nm. The material of the support layer 15s may be the same as or may be different from the material of the thermocouple layer 151. The material of the support layer 15s is not limited to a specific material. The material may be a semiconductor material such as Si, SiGe, SiC, GaAs, InAs, InSb, InP, GaN, or ZnO, or may be an insulator material such as $SiO_2$, SiN, or $Al_2O_3$. The material of the support layer 15s may be a single crystal material, may be a polycrystal material, or may be an amorphous material.

In the thermopile sensor 1h, the base material of the p-type portion 11 and the base material of the n-type portion 12 may be the same material, or may be different materials. For example, the base material of the p-type portion 11 may be Si, and the base material of the n-type portion 12 may be $SrTiO_3$. Other examples of the base materials of the p-type portion 11 and the base material of the n-type portion 12 include BiTe, Bi, Sb, Constantan, Chromel, and Alumel. Chromel is a registered trademark of Concept Alloys, Inc. The base material of the thermocouple layer 151 may be another material.

In the thermopile sensor 1h, holes may be formed in the support layer 15s. In this case, the holes may be formed in the support layer 15s in such a way as to form a phononic crystal. The holes in the support layer 15s may be formed in correspondence with the holes 10h in the first phononic crystal 11c or the second phononic crystal 12c. The holes in the support layer 15s may be formed in an arrangement pattern that is different from the arrangement pattern of the holes 10h.

The thermal conductance Gb of the beam 15b is represented as Gb=Gt+Gs by using the thermal conductance Gt of the thermocouple layer 15t and the thermal conductance Gs of the support layer 15s. For example, if the thermal conductivity of the base material of the thermocouple layer 15t is greater than or equal to 5 times the thermal conductivity of the base material of the support layer 15s, the absolute value of the thermal conductance Gb of the beam 15b is close to the absolute value of the thermal conductance Gt of the thermocouple layer 15t. In this case, the thermal conductance of the support layer 15s does not greatly affect the thermal conductance of the beam 15b. For example, suppose a case where a semiconductor or a semimetal, such as Si, $SrTiO_3$, or Bi, is used for the thermocouple layer 151 and an amorphous insulator, such as $SiO_2$ or SiN, is used for the support layer 15s. In this case, the thermal conductivity of the base material of the thermocouple layer 151 may be greater than or equal to 5 times the thermal conductivity of the base material of the support layer 15s. In this case, the thermal conductance Gt of the thermocouple layer 151 is dominant in the thermal conductance Gb of the beam 15b. Therefore, an effect obtained by regulating the boundary scattering frequency of phonons in the first phononic crystal 11c and the boundary scattering frequency of phonons in the second phononic crystal 12c is not greatly affected by the presence or absence of holes in the support layer 15s. In a case where the support layer 15*s* has holes, each hole may be a through-hole or may be a non-through-hole.

Figure 5C:
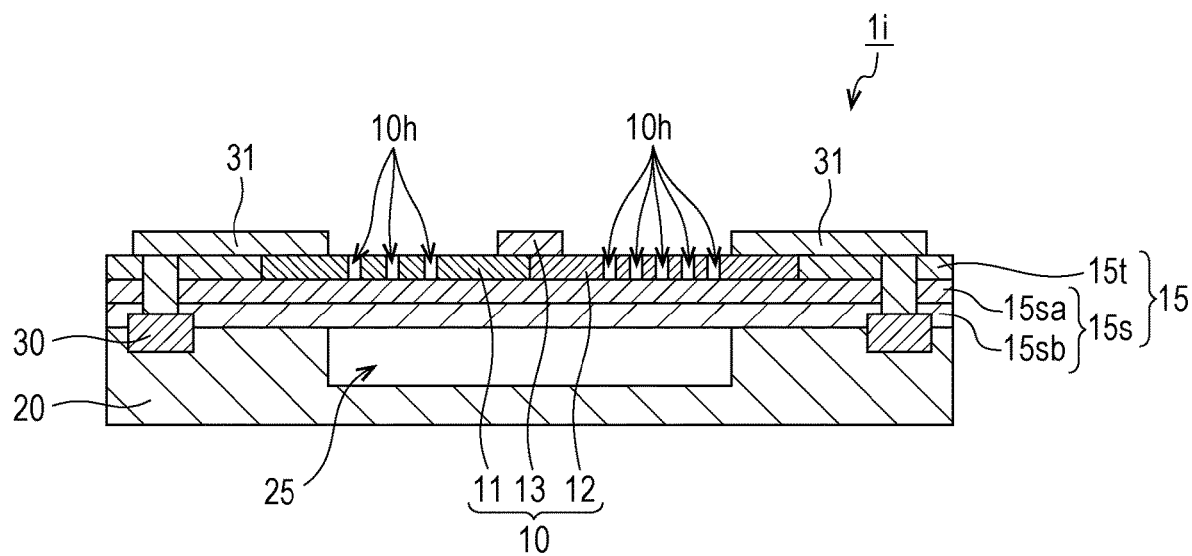
FIG. 5C is a sectional view illustrating a modification of the thermopile sensor according to the second embodiment.

FIG. 5C illustrates a modification of the thermopile sensor 1*h*. As illustrated in FIG. 5C, in a thermopile sensor 1*i*, the support layer 15*s* has multiple support layers. The support layer 15*s* has, for example, a first support layer 15*sa* and a second support layer 15*sb*. The first support layer 15*sa* is disposed between the second support layer 15*sb* and the thermocouple layer 15*l* in the thickness direction of the first support layer 15*sa*. With such a configuration, the strength of a structure in which the beam 15*b* and the sensing portion 15*d* are spanned tends to be higher, and a stress generated in the thermocouple 10 can be regulated to be in a more desirable range.

An example of a method of manufacturing the thermopile sensor 1*h* will be described. A method of manufacturing the thermopile sensor 1*h* is not limited to the following method.

Figure 6A:
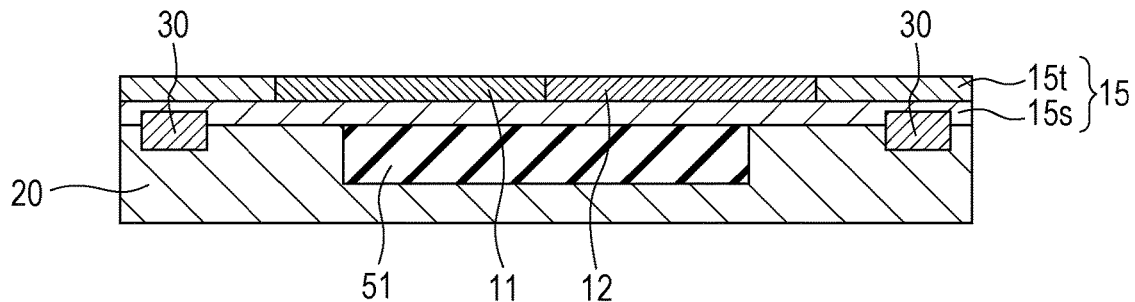
FIG. 6A is a sectional view illustrating a method of manufacturing the thermopile sensor according to the second embodiment

The thermopile sensor 1*h* can be manufactured, for example, by applying the manufacturing method of the first embodiment. As illustrated in FIG. 6A, in the same way as in the method of manufacturing the thermopile sensor 1*a*, the signal-processing circuit 30 is formed by filling the recessed portion 25 formed in the substrate 20, which is a Si substrate, with the sacrificial layer 51 made of a dielectric such as $SiO_2$. The support layer 15*s* is formed from a material, such as SiN, different from the material of the sacrificial layer 51 on the substrate 20 on which the sacrificial layer 51 has been formed. Next, the thermocouple layer 15*l* including a semiconductor such as Si is formed on the support layer 15*s*. The p-type portion 11 and the n-type portion 12 are formed in the thermocouple layer 15*l* by doping. The doping can be performed by using a method such as ion implantation.

Figure 6B:
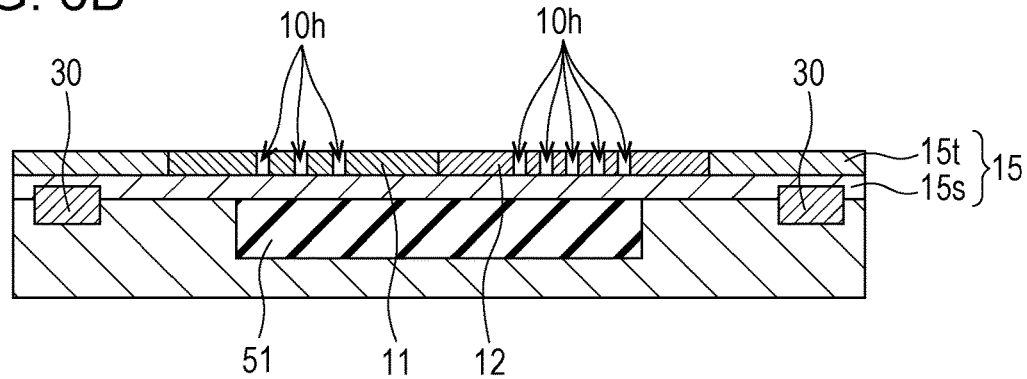
FIG. 6B is a sectional view illustrating the method of manufacturing the thermopile sensor according to the second embodiment

Next, as illustrated in FIG. 6B, by using a method the same as that in the first embodiment, phononic crystals whose boundary scattering frequencies of phonons are different from each other are formed in the p-type portion 11 and the n-type portion 12 of the thermocouple layer 15*l*. In this case, lithography is performed on the thermocouple layer 15*l*. A phononic crystal similar to that in the thermocouple layer 15*l* may be formed in the support layer 15*s* by adjusting the etching time when etching the thermocouple layer 15*t*.

Figure 6C:
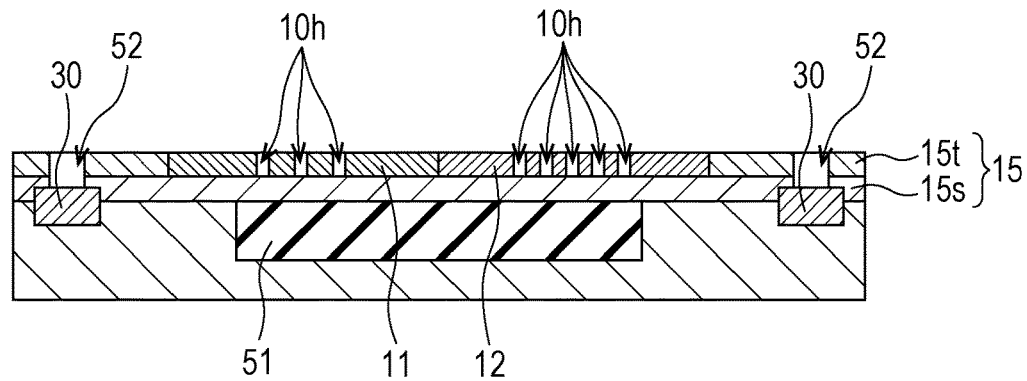
FIG. 6C is a sectional view illustrating the method of manufacturing the thermopile sensor according to the second embodiment
Figure 6D:
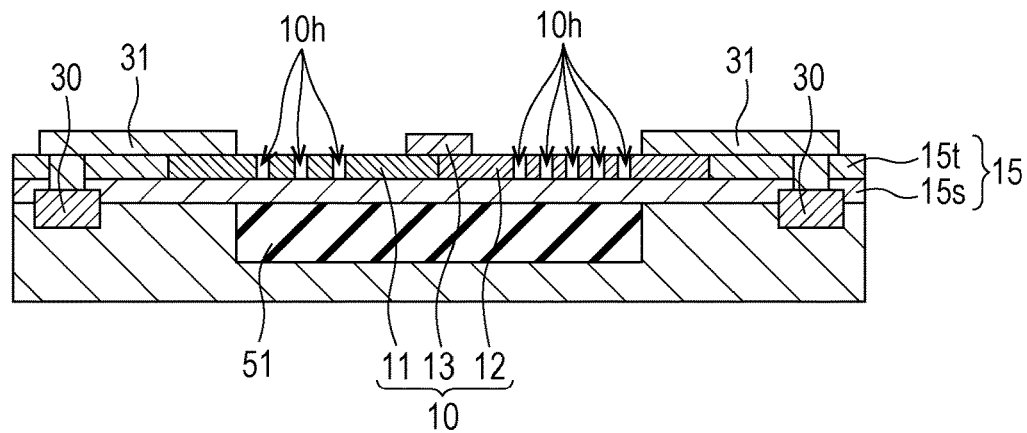
FIG. 6D is a sectional view illustrating the method of manufacturing the thermopile sensor according to the second embodiment

After the phononic crystals have been formed, the shape of the thermocouple layer 15*l* is regulated in accordance with the shapes of the p-type portion 11 and the n-type portion 12 by photolithography and etching. Subsequently, the support layer 15*s* is shaped in accordance with the shapes of the sensing portion 15*d* and the beam 15*b* by photolithography and etching. As illustrated in FIG. 6C, a contact hole 52 is formed by etching the thermocouple layer 15*l* and the support layer 15*s*. Next, a film including a material such as TiN, TaN, Al, Cr, Ti, or Cu is formed on the sensor layer 15. By etching the film, as illustrated in FIG. 6D, the hot junction 13, the wiring 31, and the electrode pad 33 are formed.

Lastly, by removing the sacrificial layer 51 by selective etching, the recessed portion 25 is formed in the substrate 20. Thus, the beam 15*b* and the sensing portion 15*d* in the sensor layer 15 are spanned in a state of being separated from the substrate 20. Alternatively, the sensing portion 15*d* may be spanned in a state of being separated from the substrate 20 by removing a part of the substrate 20 by anisotropic etching. In this case, the step of forming the recessed portion 25 in the substrate 20 can be omitted.

Third Embodiment

Figure 7A:
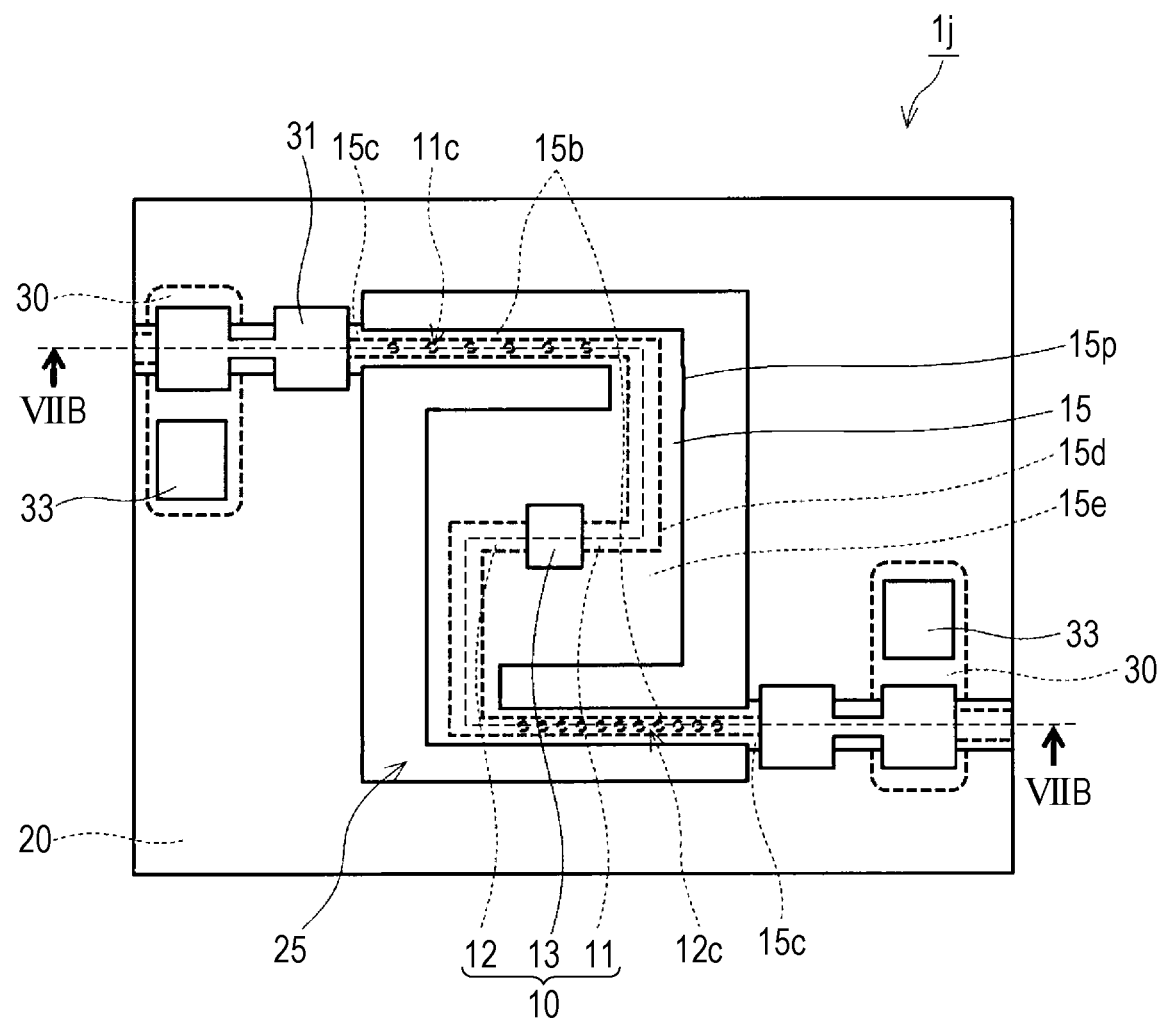
FIG. 7A is a plan view schematically illustrating a thermopile sensor according to a third embodiment.
Figure 7B:
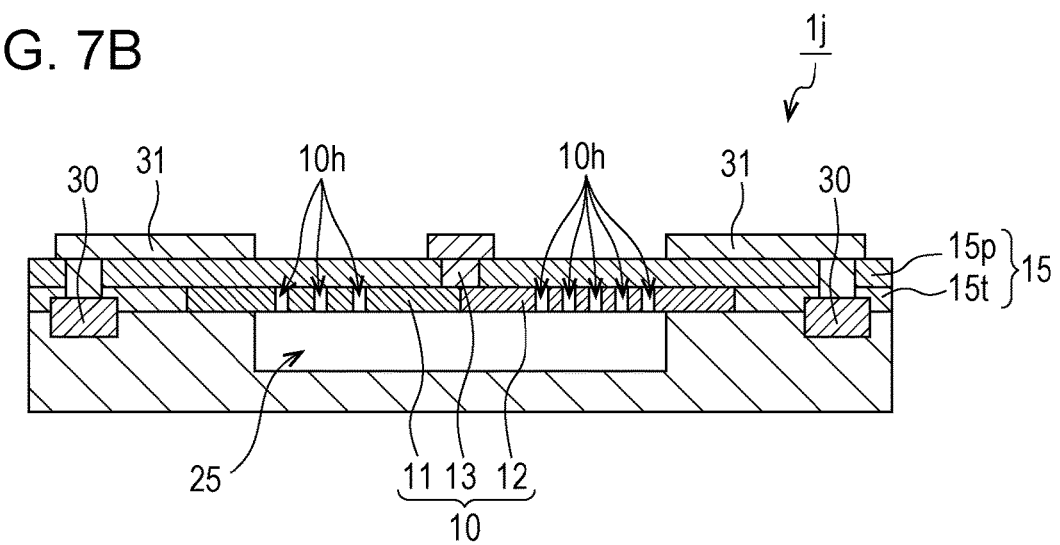
FIG. 7B is a sectional view of the thermopile sensor of FIG. 7A taken along line VIIB-VIIB.

FIGS. 7A and 7B illustrate a thermopile sensor 1*j* according to a third embodiment. Except for portions that will be specifically described, the thermopile sensor 1*j* is configured in the same way as the thermopile sensor 1*a*. Elements of the thermopile sensor 1*j* that are the same as or in correspondence with those of the thermopile sensor 1*a* will be denoted by the same numerals, and descriptions of such elements will be omitted. Descriptions of the thermopile sensor 1*a* also apply to the thermopile sensor 1*j*, unless technologically contradictory.

As illustrated in FIGS. 7A and 7B, in the thermopile sensor 1*j*, the sensor layer 15 has a protective layer 15*p* that covers the p-type portion 11 and the n-type portion 12. The sensor layer 15 includes, for example, the thermocouple layer 15*l* including the p-type portion 11 and the n-type portion 12. A contact hole is formed at the center of the protective layer 15*p*, and the hot junction 13 is formed inside of the contact hole and on a region of the main surface of the protective layer 15*p* around the contact hole. The strength of a structure in which the beam 15*b* and the sensing portion 15*d* are spanned tends to be high due to the protective layer 15*p*. In addition, a stress generated in the thermocouple 10 can be regulated due to the protective layer 15*p*. The thermocouple 10 can be protected from oxidation environments and chemical solutions due to the protective layer 15*p*.

The thickness of the protective layer 15*p* is not limited to a specific value. The thickness is, for example, greater than or equal to 10 nm and less than or equal to 500 nm. The material of the protective layer 15*p* may be the same as or may be different from the material of the thermocouple layer 15*l*. The material of the protective layer 15*p* is not limited to a specific material. The material may be a semiconductor material such as Si, SiGe, SiC, GaAs, InAs, InSb, InP, GaN, or ZnO, or may be an insulator material such as $SiO_2$, SiN, or $Al_2O_3$. The material of the protective layer 15*p* may be a single crystal material, may be a polycrystal material, or may be an amorphous material.

In the thermopile sensor 1*j*, the base materials of the p-type portion 11 and the base material of the n-type portion 12 may be the same material, or may be different materials. For example, the base material of the p-type portion 11 may be Si, and the base material of the n-type portion 12 may be $SrTiO_3$. Other examples of the base materials of the p-type portion 11 and the base material of the n-type portion 12 include BiTe, Bi, Sb, Constantan, Chromel, and Alumel. Chromel is a registered trademark of Concept Alloys, Inc. The base material of the thermocouple layer 15*t* may be another material.

In the thermopile sensor 1*j*, holes may be formed in the support layer 15*s*. In this case, holes may be formed in the protective layer 15*p* in such a way as to form a phononic crystal. The holes in the protective layer 15*p* may be formed in correspondence with the holes 10*h* in the first phononic crystal 11*c* or the second phononic crystal 12*c*, or may be formed in an arrangement pattern that is different from the arrangement pattern of the holes 10*h*.

The thermal conductance Gb of the beam 15*b* is represented as Gb=Gt+Gp by using the thermal conductance Gt of the thermocouple layer 15*t* and the thermal conductance Gp of the protective layer 15*p*. For example, if the thermal conductivity of the base material of the thermocouple layer 15*t* is greater than or equal to 5 times the thermal conductivity of the base material of the protective layer 15*p*, the absolute value of the thermal conductance Gb of the beam 15*b* is close to the absolute value of the thermal conductance Gt of the thermocouple layer 15*t*. In this case, the thermal conductance of the protective layer 15*p* does not greatly affect the thermal conductance of the beam 15*b*. For example, suppose a case where a semiconductor or a semimetal, such as Si, SrTiO$_3$, or Bi, is used for the thermocouple layer 151 and an amorphous insulator, such as SiO$_2$ or SiN, is used for the protective layer 15p. In this case, the thermal conductivity of the base material of the thermocouple layer 151 may be greater than or equal to 5 times the thermal conductivity of the base material of the protective layer 15p. In this case, the thermal conductance Gt of the thermocouple layer 151 is dominant in the thermal conductance Gb of the beam 15b. Therefore, an effect obtained by regulating the boundary scattering frequency of phonons in the first phononic crystal 11c and the boundary scattering frequency of phonons in the second phononic crystal 12c is not greatly affected by the presence or absence of holes in the protective layer 15p. In a case where the protective layer 15p has holes, each hole may be a through-hole or may be a non-through-hole.

Figure 7C:
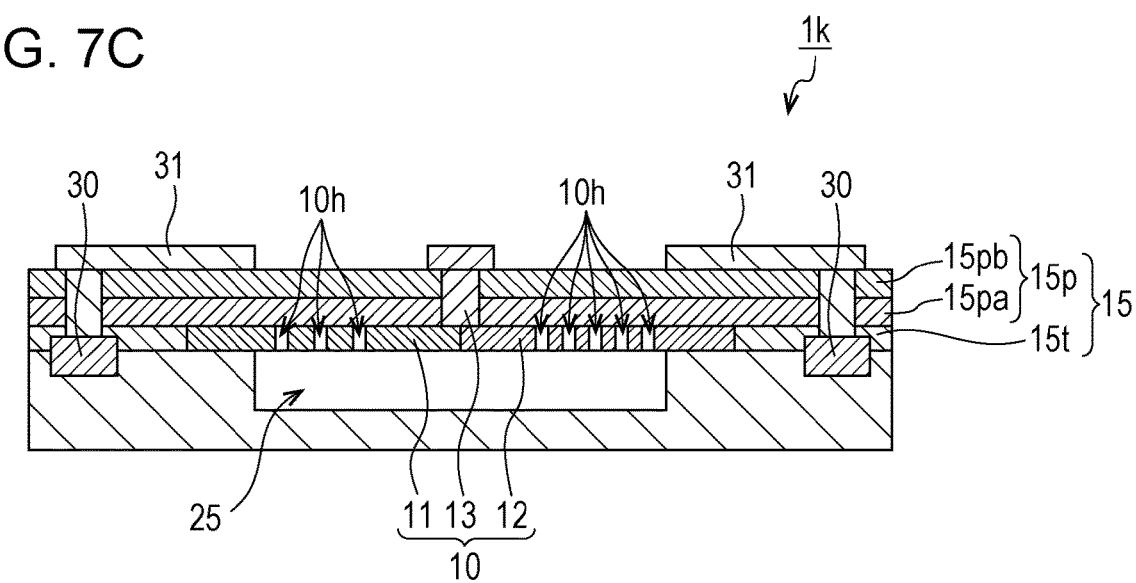
FIG. 7C is a sectional view illustrating a modification of the thermopile sensor according to the third embodiment.
Figure 7D:
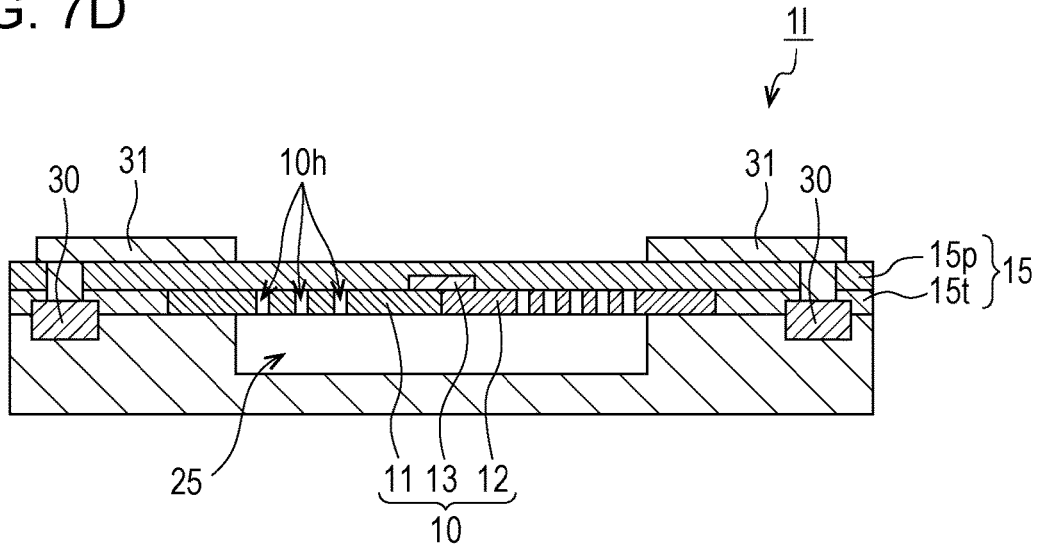
FIG. 7D is a sectional view illustrating a modification of the thermopile sensor according to the third embodiment.

FIGS. 7C and 7D illustrate modifications of the thermopile sensor 1j. As illustrated in FIG. 7C, in a thermopile sensor 1k, the protective layer 15p has multiple protective layers. The protective layer 15p has, for example, a first protective layer 15pa and a second protective layer 15pb. The first protective layer 15pa is disposed between the second protective layer 15pb and the thermocouple layer 15t in the thickness direction of the first protective layer 15pa. With such a configuration, the strength of a structure in which the beam 15b and the sensing portion 15d are spanned tends to be higher, and a stress generated in the thermocouple 10 can be regulated to be in a more desirable range. In addition, the thermocouple 10 can be more reliably protected from oxidation environments and chemical solutions.

As illustrated in FIG. 7D, in a thermopile sensor 1l, the hot junction 13 may be covered by the protective layer 15p. Thus, the hot junction 13 can be protected by the protective layer 15p.

An example of a method of manufacturing the thermopile sensor 1j will be described. A method of manufacturing the thermopile sensor 1j is not limited to the following method.

Figure 8A:
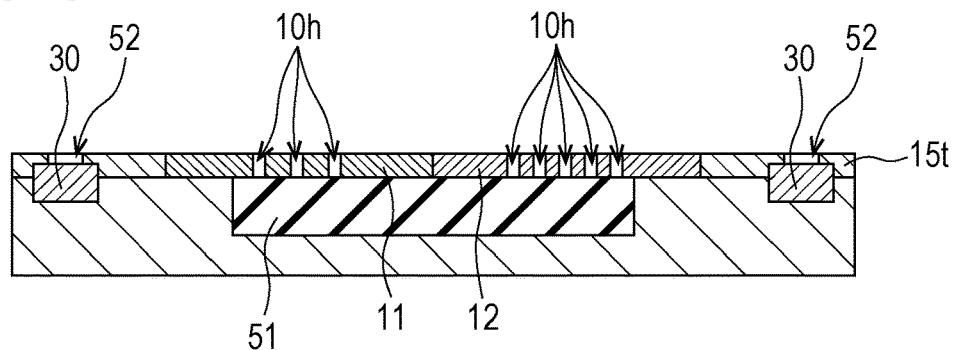
FIG. 8A is a sectional view illustrating a method of manufacturing the thermopile sensor according to the third embodiment.

The thermopile sensor 1j can be manufactured, for example, by applying the manufacturing method of the first embodiment. As illustrated in FIG. 8A, in the same way as in the method of manufacturing the thermopile sensor 1a, the signal-processing circuit 30 is formed by filling the recessed portion 25 formed in the substrate 20, which is a Si substrate, with the sacrificial layer 51 made of a dielectric such as SiO$_2$. The thermocouple layer 151 including a semiconductor, such as Si, is formed on the substrate 20 on which the sacrificial layer 51 has been formed. The p-type portion 11 and the n-type portion 12 are formed in the thermocouple layer 151 by doping. The doping can be performed by using a method such as ion implantation.

Next, by using a method the same as that in the first embodiment, phononic crystals whose boundary scattering frequencies of phonons are different from each other are formed in the p-type portion 11 and the n-type portion 12 of the thermocouple layer 151. After the phononic crystals have been formed, the shape of the thermocouple layer 151 is regulated in accordance with the shapes of the p-type portion 11 and the n-type portion 12 by photolithography and etching. In this case, as illustrated in FIG. 8A, the contact hole 52 is formed.

Figure 8B:
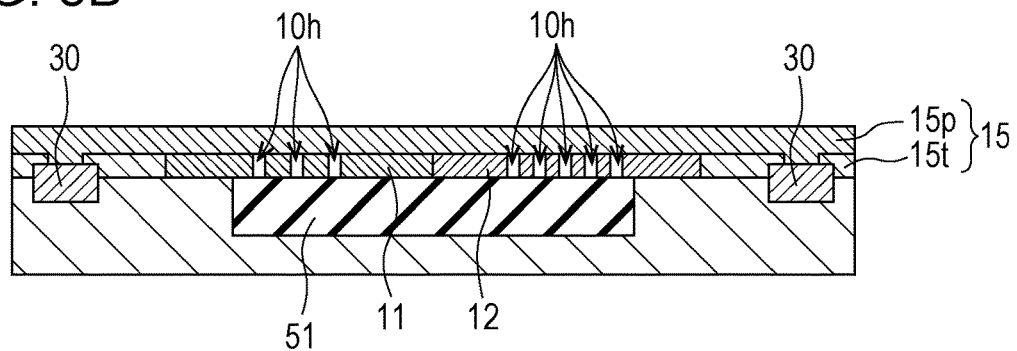
FIG. 8B is a sectional view illustrating the method of manufacturing the thermopile sensor according to the third embodiment.
Figure 8C:
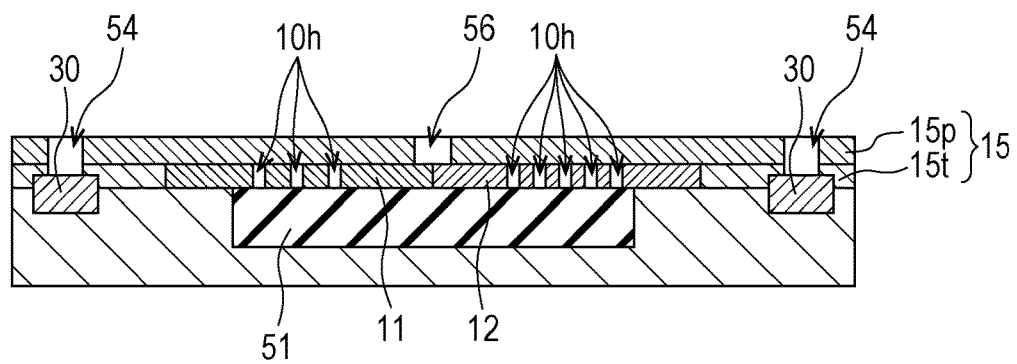
FIG. 8C is a sectional view illustrating the method of manufacturing the thermopile sensor according to the third embodiment.
Figure 8D:
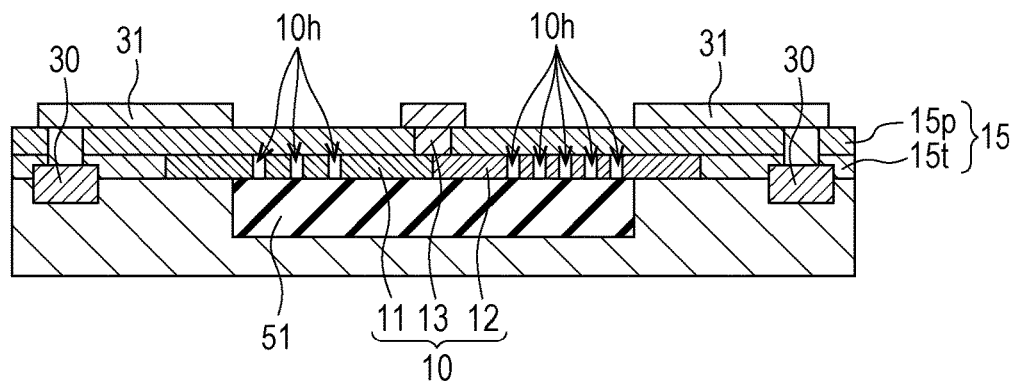
FIG. 8D is a sectional view illustrating the method of manufacturing the thermopile sensor according to the third embodiment.

Next, as illustrated in FIG. 8B, the protective layer 15p, including a material such as SiN, is formed on the thermocouple layer 15t. Subsequently, the protective layer 15p is shaped in accordance with the shapes of the sensing portion 15d and the beam 15b by photolithography and etching. As illustrated in FIG. 8C, a contact hole 54 and a contact hole 56 are formed by etching the protective layer 15p. Next, a film including a material such as TiN, TaN, Al, Cr, Ti, or Cu is formed on the sensor layer 15. By etching the film, as illustrated in FIG. 8D, the hot junction 13, the wiring 31, and the electrode pad 33 are formed.

Lastly, by removing the sacrificial layer 51 by selective etching, the recessed portion 25 is formed in the substrate 20. Thus, the beam 15b and the sensing portion 15d in the sensor layer 15 are spanned in a state of being separated from the substrate 20. Alternatively, the sensing portion 15d may be spanned in a state of being separated from the substrate 20 by removing a part of the substrate 20 by anisotropic etching. In this case, the step of forming the recessed portion 25 in the substrate 20 can be omitted.

Fourth Embodiment

Figure 9A:
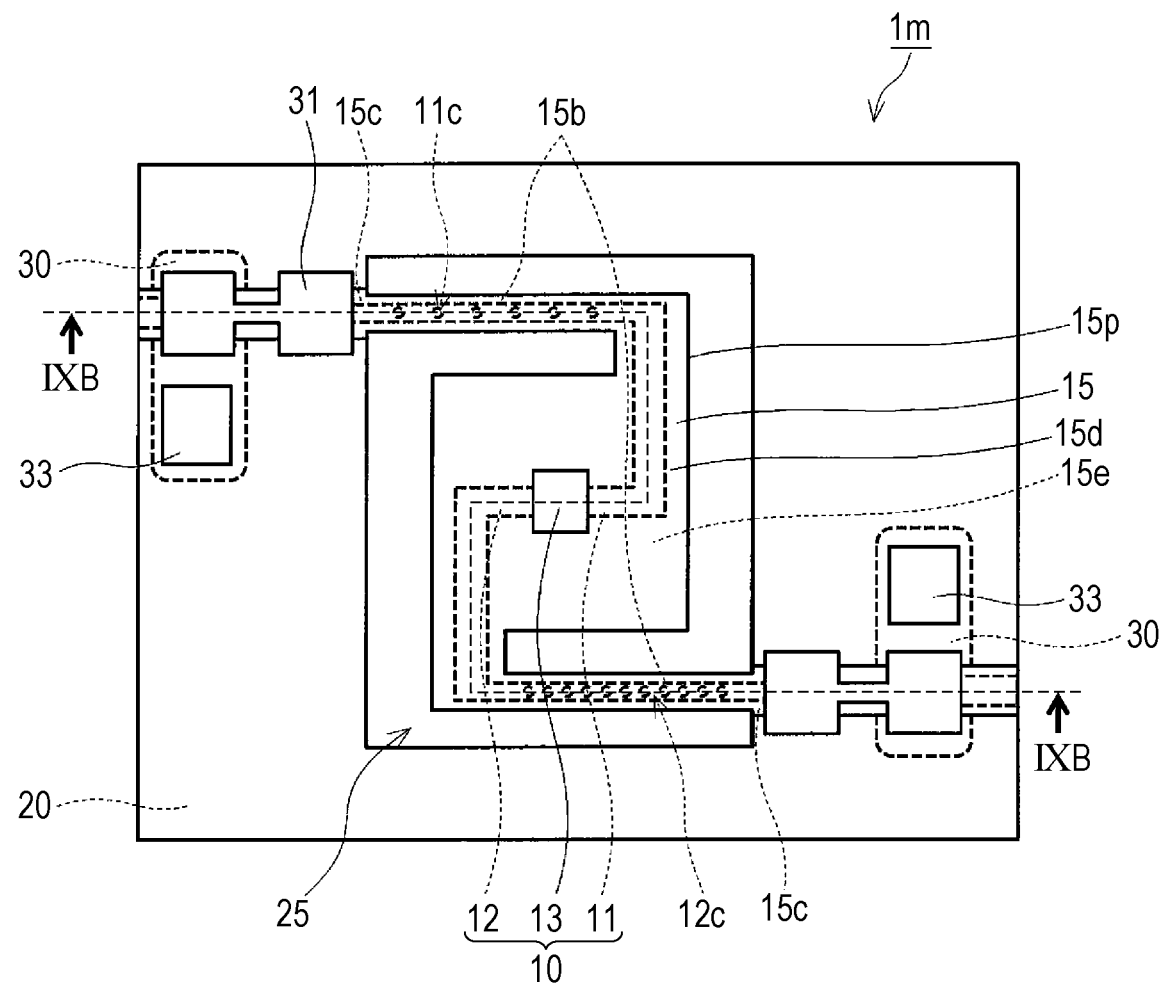
FIG. 9A is a plan view schematically illustrating a thermopile sensor according to a fourth embodiment.
Figure 9B:
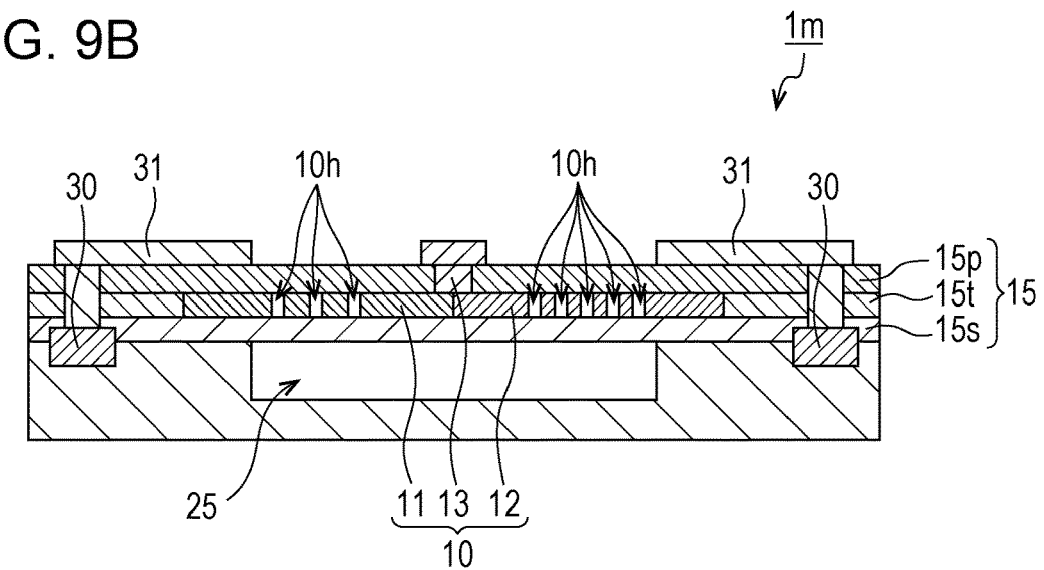
FIG. 9B is a sectional view of the thermopile sensor of FIG. 9A taken along line IXB-IXB.

FIGS. 9A and 9B illustrate a thermopile sensor 1m according to a fourth embodiment. Except for portions that will be specifically described, the thermopile sensor 1m is configured in the same way as the thermopile sensor 1a. Elements of the thermopile sensor 1m that are the same as or in correspondence with those of the thermopile sensor 1a will be denoted by the same numerals, and descriptions of such elements will be omitted. Descriptions of the thermopile sensor 1a also apply to the thermopile sensor 1m, unless technologically contradictory.

The sensor layer 15 of the thermopile sensor 1m includes the support layer 15s and the protective layer 15p. The thermocouple 10 is disposed on the support layer 15s. The protective layer 15p covers the p-type portion 11 and the n-type portion 12. The sensor layer 15 includes, for example, the thermocouple layer 151 including the p-type portion 11 and the n-type portion 12. The thermocouple layer 151 is disposed between the support layer 15s and the protective layer 15p in the thickness direction thereof. A contact hole is formed at the center of the protective layer 15p, and the hot junction 13 is formed inside of the contact hole and on a region of the main surface of the protective layer 15p around the contact hole. With such a configuration, the strength of a structure in which the beam 15b and the sensing portion 15d are spanned tends to be higher, and a stress generated in the thermocouple 10 can be regulated to be in a more desirable range. In addition, the thermocouple 10 can be more reliably protected from oxidation environments and chemical solutions.

In the thermopile sensor 1m, the materials of the support layer 15s, the protective layer 15p, and the thermocouple layer 15t may be, for example, the materials described in the second and third embodiments.

In the thermopile sensor 1m, holes may be formed in the support layer 15s and the protective layer 15p. In this case, the holes may be formed in the support layer 15s and the protective layer 15p in such a way as to form a phononic crystal. The holes in the support layer 15s and the protective layer 15p may be formed in correspondence with the holes 10h in the first phononic crystal 11c or the second phononic crystal 12c. The holes in the support layer 15s and the protective layer 15p may be formed in an arrangement pattern that is different from the arrangement pattern of the holes 10h. As described in the second and third embodiments, an effect obtained by regulating the boundary scattering frequencies of phonons in the first phononic crystal 11c and the second phononic crystal 12c is not greatly affected by the presence or absence of holes in the support layer 15s and the protective layer 15p. In a case where the support layer 15s and the protective layer 15p have holes, each hole may be a through-hole or may be a non-through-hole.

Figure 9C:
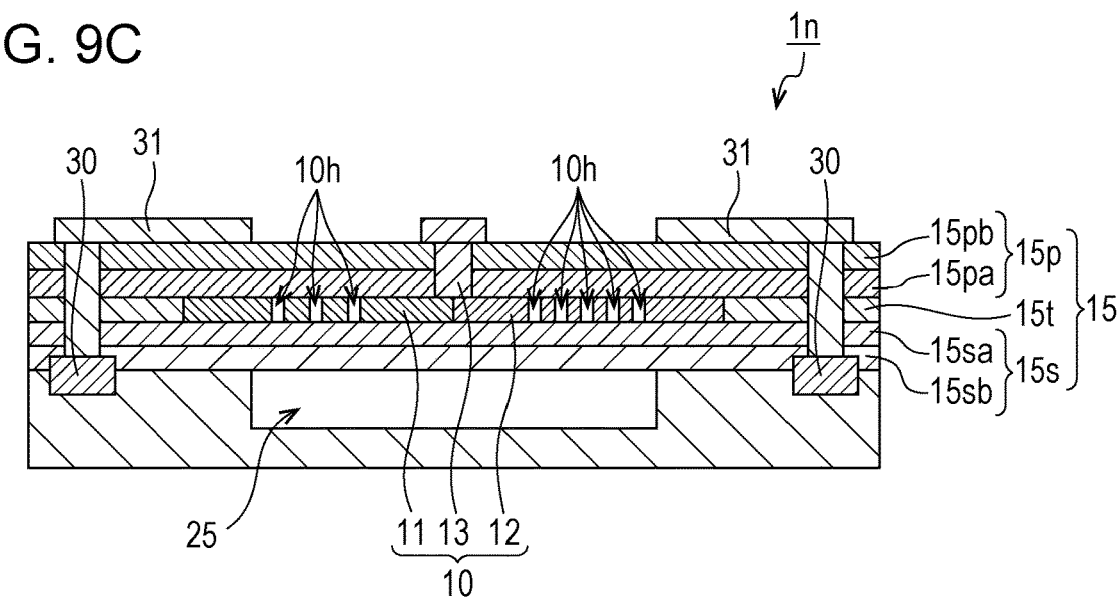
FIG. 9C is a sectional view illustrating a modification of the thermopile sensor according to the fourth embodiment.
Figure 9D:
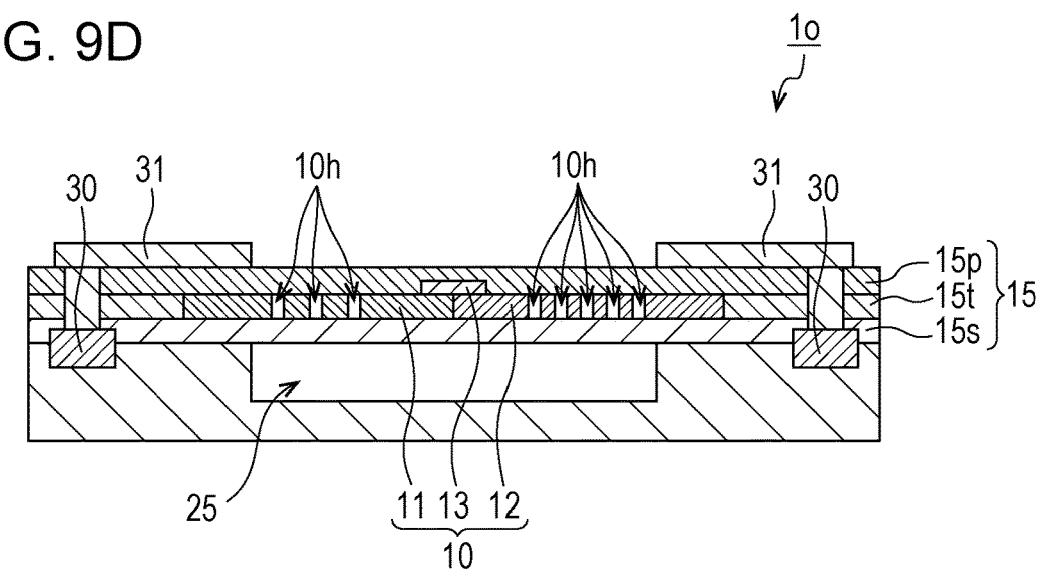
FIG. 9D is a sectional view illustrating another modification of the thermopile sensor according to the fourth embodiment.

FIGS. 9C and 9D illustrate modifications of the thermopile sensor 1m. As illustrated in FIG. 9C, in a thermopile sensor 1n, the support layer 15s has multiple support layers. In addition, the protective layer 15p has multiple protective layers. The support layer 15s has, for example, the first support layer 15sa and the second support layer 15sb. The first support layer 15sa is disposed between the second support layer 15sb and the thermocouple layer 15t in the thickness direction of the first support layer 15sa. The protective layer 15p has, for example, the first protective layer 15pa and the second protective layer 15pb. The first protective layer 15pa is disposed between the second protective layer 15pb and the thermocouple layer 15t in the thickness direction of the first protective layer 15pa. With such a configuration, the strength of a structure in which the beam 15b and the sensing portion 15d are spanned tends to be higher, and a stress generated in the thermocouple 10 can be regulated to be in a more desirable range. In addition, the thermocouple layer 15t can be more reliably protected from oxidation environments and chemical solutions.

As illustrated in FIG. 9D, in a thermopile sensor 1o, the hot junction 13 may be covered by the protective layer 15p. Thus, the hot junction 13 can be protected by the protective layer 15p.

The thermopile sensor 1m can be manufactured by applying the manufacturing methods described in the second and third embodiments.

Fifth Embodiment

Figure 10A:
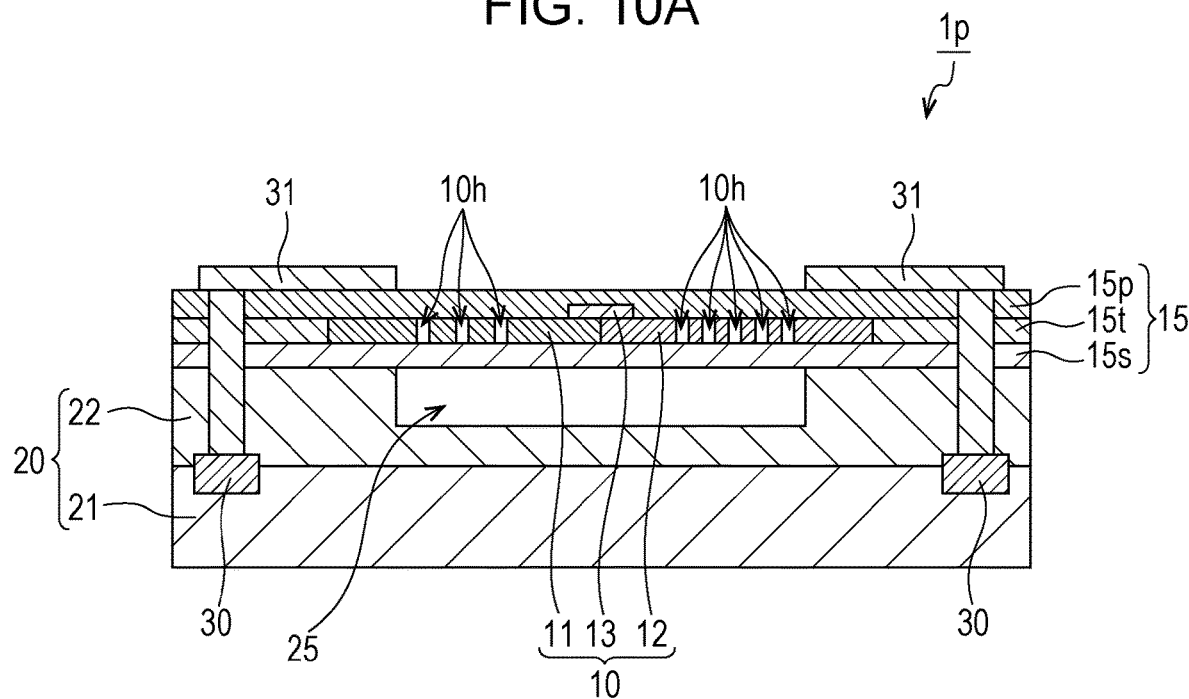
FIG. 10A is a plan view schematically illustrating a thermopile sensor according to a fifth embodiment.

FIG. 10A illustrates a thermopile sensor 1p according to a fifth embodiment. Except for portions that will be specifically described, the thermopile sensor 1p is configured in the same way as the thermopile sensor 1a. Elements of the thermopile sensor 1p that are the same as or in correspondence with those of the thermopile sensor 1a will be denoted by the same numerals, and descriptions of such elements will be omitted. Descriptions of the thermopile sensor 1a also apply to the thermopile sensor 1p, unless technologically contradictory.

As illustrated in FIG. 10A, in the thermopile sensor 1p, the substrate 20 includes a first substrate 21 and an interlayer film 22. The interlayer film 22 is disposed between the first substrate 21 and the sensor layer 15 in the thickness of direction of the interlayer film 22. The recessed portion 25 is formed in the interlayer film 22. The material of the interlayer film 22 is an insulator or a semiconductor, such as $SiO_2$, SiN, or Si.

As illustrated in FIG. 10A, the sensor layer 15 includes the support layer 15s, the thermocouple layer 15t, and the protective layer 15p. The sensor layer 15 may have a single layer structure including the thermocouple layer 15t, or may have another multilayer structure.

Figure 10B:
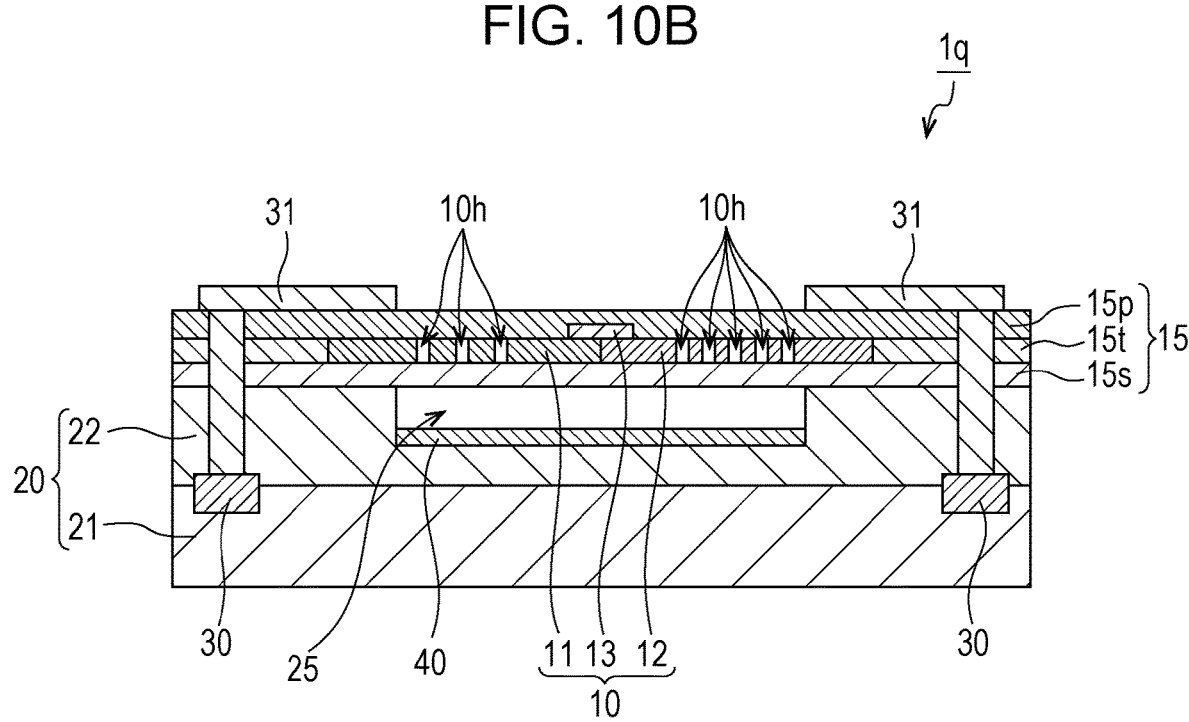
FIG. 10B is a sectional view illustrating a modification of the thermopile sensor according to the fifth embodiment.
Figure 10C:
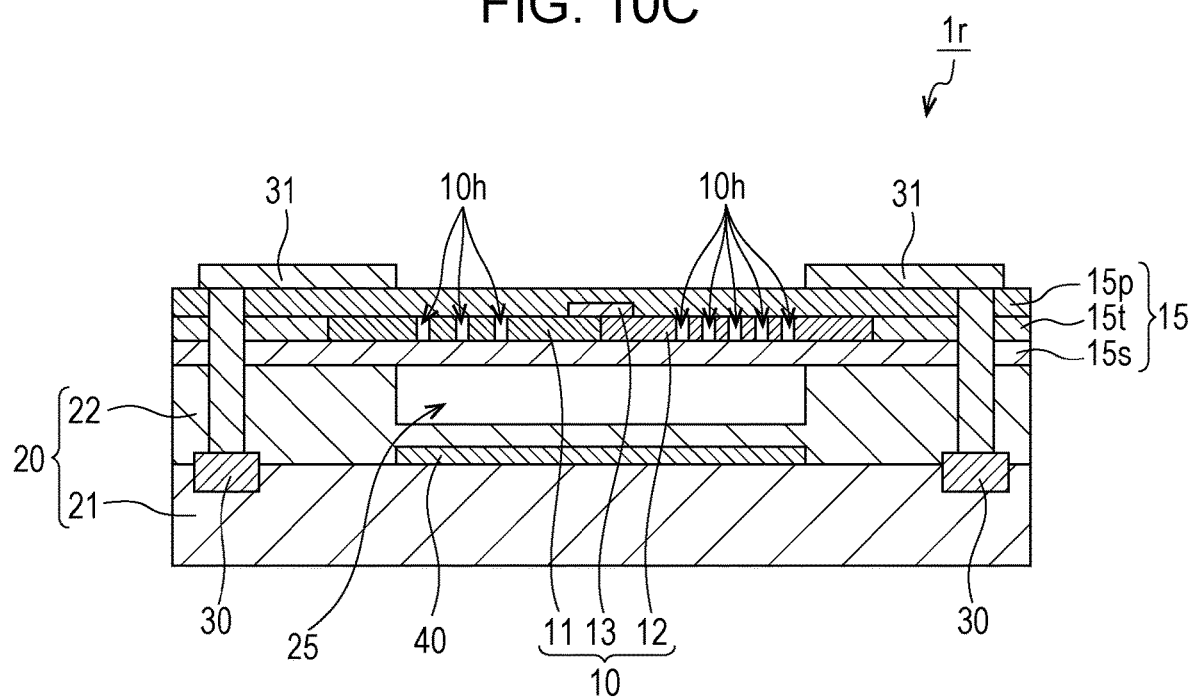
FIG. 10C is a sectional view illustrating another modification of the thermopile sensor according to the fifth embodiment.
Figure 10D:
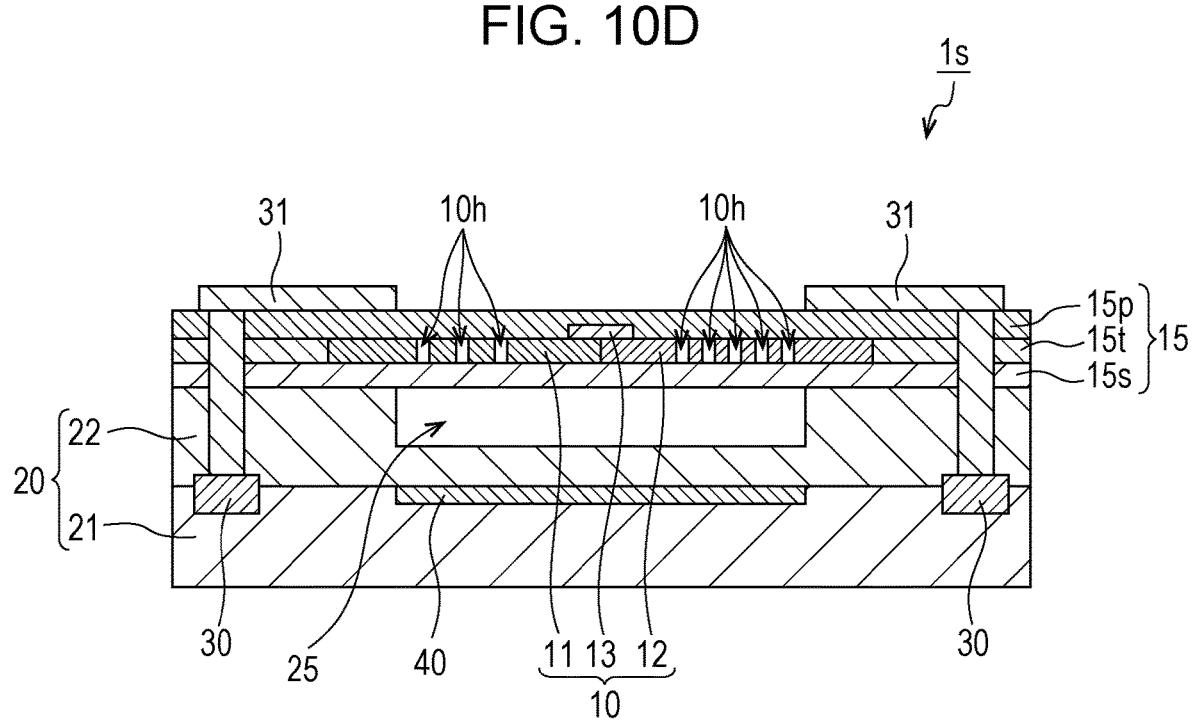
FIG. 10D is a sectional view illustrating still another modification of the thermopile sensor according to the fifth embodiment.

FIGS. 10B, 10C, and 10D illustrate modifications of the thermopile sensor 1p. As illustrated in FIGS. 10B, 10C, and 10D, each of thermopile sensors 1q, 1r, and is includes the infrared reflection layer 40. In the thermopile sensor 1q, the infrared reflection layer 40 is disposed on the bottom surface of the recessed portion 25. In the thermopile sensor 1r, the infrared reflection layer 40 is disposed on the main surface of the first substrate 21. In the thermopile sensor 1s, the infrared reflection layer 40 is formed in such a way as to form a part of the main surface of the first substrate 21. For example, when the first substrate 21 is a Si substrate, the infrared reflection layer 40 is obtained by doping a region of the main surface of the first substrate 21 corresponding to the infrared reflection layer 40 with a high-concentration dopant.

The material of the infrared reflection layer 40 is not limited to a specific material. The material may be a metal such as Al, Cu, W, or Ti, may be a metal compound such as TiN or TaN, or may be highly-conductive Si.

Figure 11A:
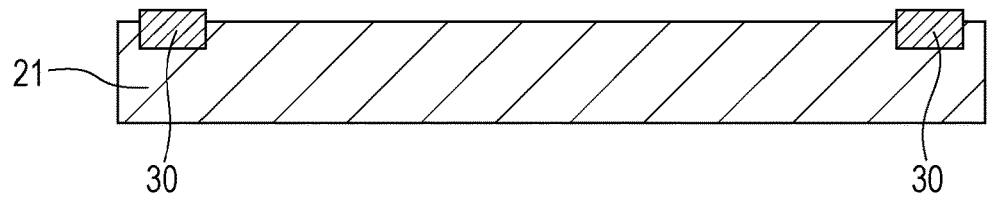
FIG. 11A is a sectional view illustrating a method of manufacturing the thermopile sensor according to the fifth embodiment.

An example of a method of manufacturing the thermopile sensor 1p will be described. The thermopile sensor 1p can be manufactured, for example, by applying the method of manufacturing the thermopile sensor 1a according to the first embodiment. As illustrated in FIG. 11A, the signal-processing circuit 30 including a transistor device is formed on the first substrate 21, which is a Si substrate. When the infrared reflection layer 40 is to be formed in such a way as to form a part of the main surface of the first substrate 21 as in the thermopile sensor 1s, the infrared reflection layer 40 may be formed by doping a part of the main surface of the first substrate 21 with a high-concentration dopant.

Figure 11B:
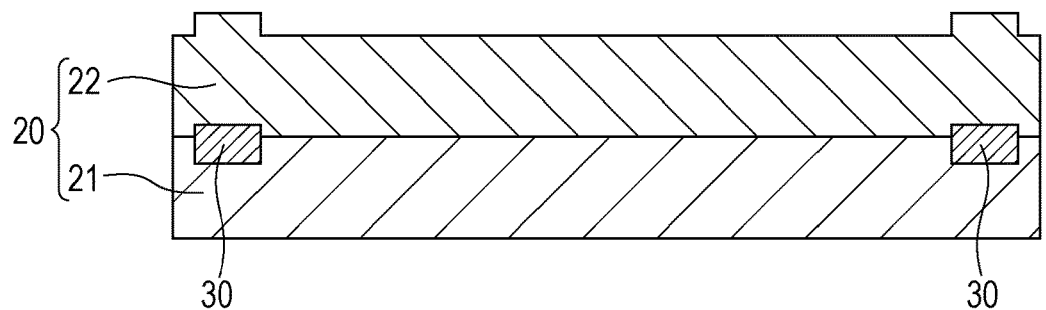
FIG. 11B a sectional view illustrating the method of manufacturing the thermopile sensor according to the fifth embodiment.
Figure 11C:
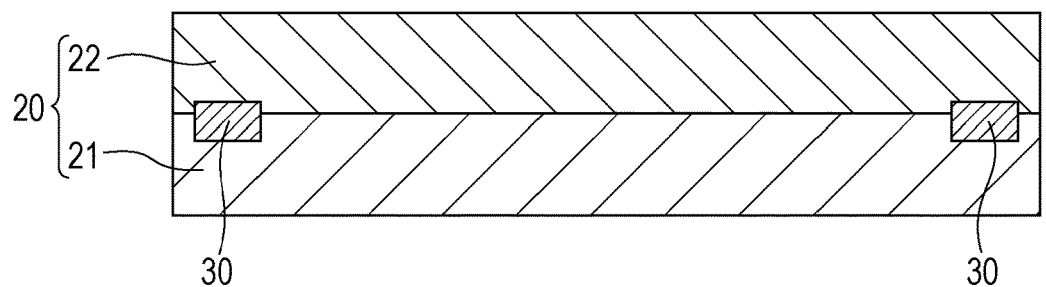
FIG. 11C a sectional view illustrating the method of manufacturing the thermopile sensor according to the fifth embodiment.

Next, as illustrated in FIG. 11B, the interlayer film 22, which is made of a dielectric such as $SiO_2$, is formed on the surface of the first substrate 21. At this time, protrusions and recesses may be generated on the surface of the interlayer film 22 in accordance with the height of the signal-processing circuit 30. As illustrated in FIG. 11C, the protrusions and recesses may be removed by CMP to flatten the surface of the interlayer film 22. Thus, in the following lithography step, a photoresist and a film of block copolymer tend to be formed in a desirable state.

Figure 11D:
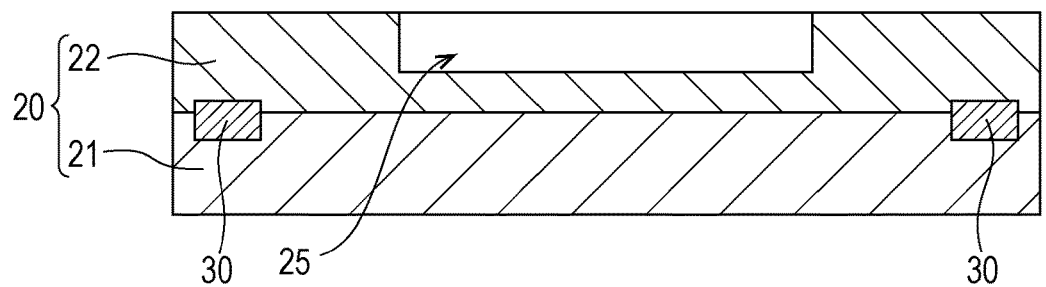
FIG. 11D a sectional view illustrating the method of manufacturing the thermopile sensor according to the fifth embodiment.
Figure 11E:
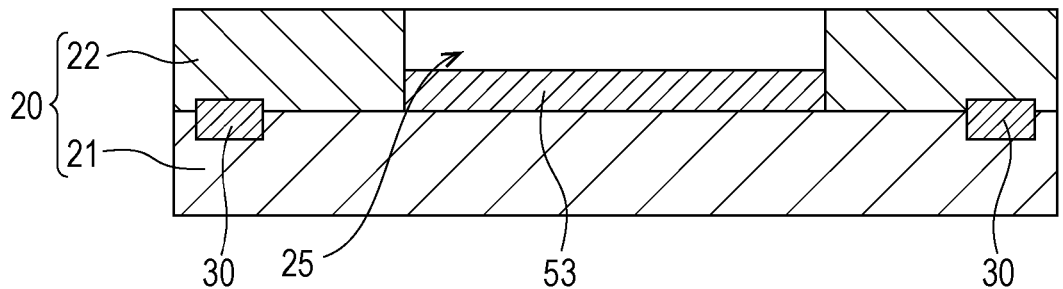
FIG. 11E a sectional view illustrating the method of manufacturing the thermopile sensor according to the fifth embodiment.

Next, as illustrated in FIG. 11D, the recessed portion 25 is formed in the interlayer film 22 by photolithography and etching. In forming the recessed portion 25, the main surface of the first substrate 21 may become exposed. In this case, as illustrated in FIG. 11E, a dielectric protective film 53 is formed in the recessed portion 25. The dielectric protective film 53 is, for example, a dielectric film having a thickness of about 100 nm and made of SiN or the like. Thus, the main surface of the first substrate 21 is protected.

Figure 11F:
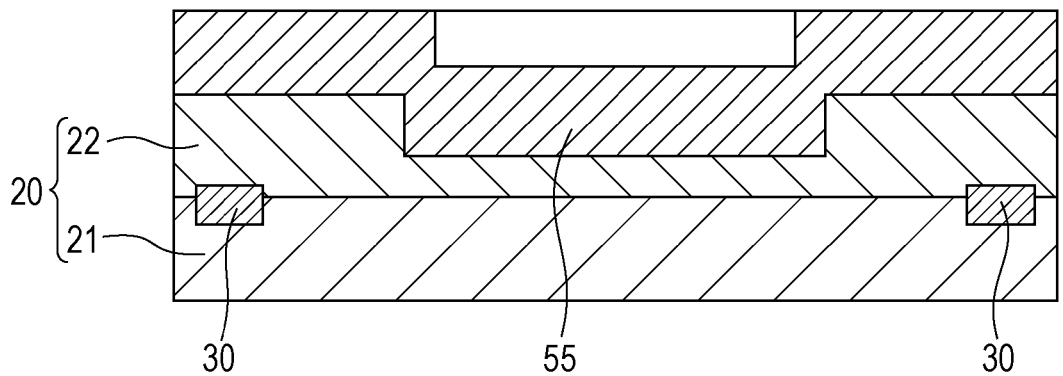
FIG. 11F a sectional view illustrating the method of manufacturing the thermopile sensor according to the fifth embodiment.
Figure 11G:
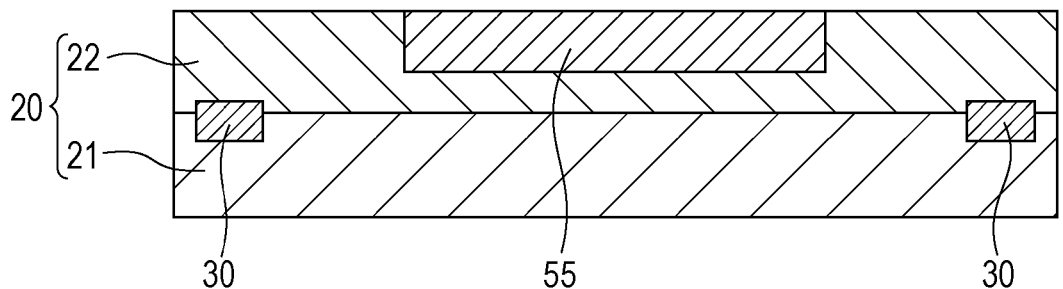
FIG. 11G a sectional view illustrating the method of manufacturing the thermopile sensor according to the fifth embodiment.

Next, as illustrated in FIG. 11F, a sacrificial layer 55 is formed in such a way as to cover the recessed portion 25. The material of the sacrificial layer 55 is different from the material of the interlayer film 22. The material of the sacrificial layer 55 is, for example, Si. Next, as illustrated in FIG. 11G, the sacrificial layer 55 outside of the recessed portion 25 is removed by using a method such as CMP. The thermopile sensor 1p can be manufactured by subsequently applying the manufacturing methods described in the first embodiment, the second embodiment, and the third embodiment.

Sixth Embodiment

Figure 12A:
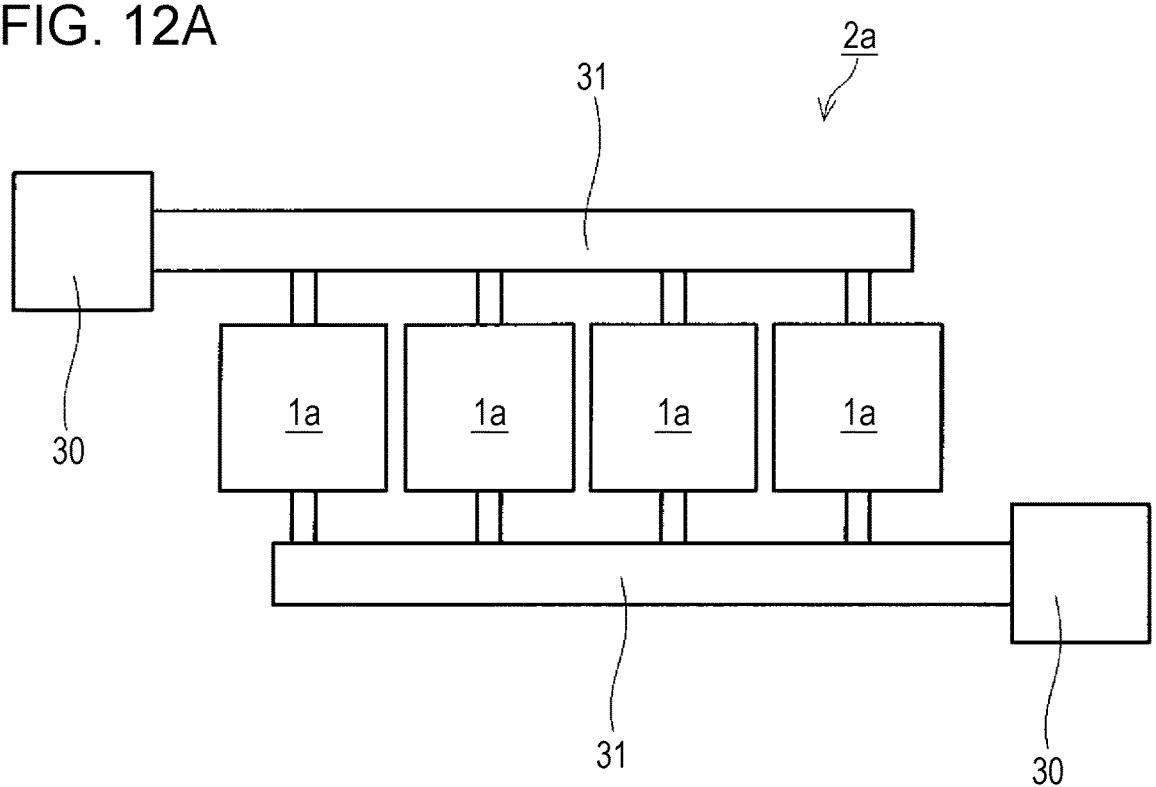
FIG. 12A is plan view schematically illustrating a sensor array according to a sixth embodiment.
Figure 12B:
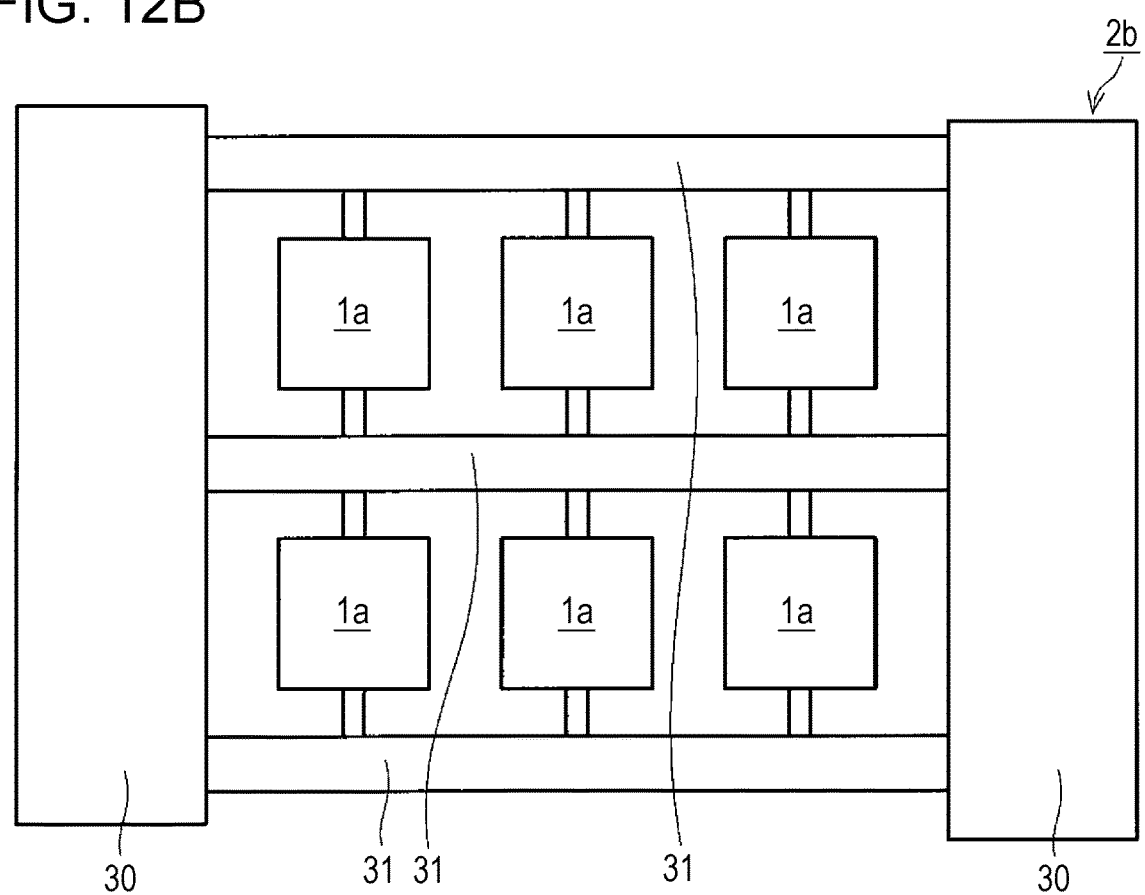
FIG. 12B is plan view schematically illustrating a sensor array according to the sixth embodiment.

FIGS. 12A and 12B illustrate sensor arrays 2a and 2b according to a sixth embodiment. The sensor arrays 2a and 2b include thermopile sensors 1a forming a one-dimensional array or a two-dimensional array. The thermopile sensors 1a forming a one-dimensional array or a two-dimensional array are connected to each other by the signal-processing circuit 30 and the wiring 31. In the sensor arrays 2a and 2b, the thermopile sensors forming a one-dimensional array or a two-dimensional array may include any one of the thermopile sensors 1b to 1s, instead of the thermopile sensor 1a. In the sensor arrays 2a and 2b, the thermopile sensors forming a one-dimensional array or a two-dimensional array may include multiple types of sensors selected from the thermopile sensors 1b to 1s.

EXAMPLES

Hereafter, referring to Examples, the present embodiment will be described in more detail. However, a thermopile sensor according to the present embodiment is not limited to any of the forms described in the following Examples.

Example 1

A p-type Si film into which boron ions had been injected as an impurity with a dose of $1 \times 10^{16}$ cm$^{-2}$ and an n-type Si film into which phosphorous ions had been injected as an impurity with a dose of $4 \times 10^{15}$ cm$^{-2}$ were prepared. The thickness of each of the p-type Si film and the n-type Si film was 150 nm.

In accordance with a thermoreflectance method, the thermal conductivities of the p-type Si film and the n-type Si film were measured. Before a phononic crystal was formed, the thermal conductivity of the p-type Si film at 25° C. was 28 W/(m·K). Before a phononic crystal was formed, the thermal conductivity of the n-type Si film at 25° C. was 39 W/(m·K). It can be understood that the thermal conductivity of the n-type Si film was higher than the thermal conductivity of the p-type Si film by about 40%.

A phononic crystal was formed in each of the p-type Si film and the n-type Si film. In forming the phononic crystal, holes were arranged in a tetragonal lattice pattern. In addition, the period P of the arrangement of the holes and the diameter D of the holes were regulated so that the ratio of the sum of the areas of holes to the area of the phononic crystal in a plan view of the phononic crystal became 50%. Due to forming of the phononic crystal, the boundary scattering frequency of phonons increased, and the thermal conductivities of the p-type Si film and the n-type Si film decreased. A phononic crystal having a period P of 1000 nm and a diameter D of 800 nm was formed in the p-type Si film. On the other hand, a phononic crystal having a period P of 400 nm and a diameter D of 320 nm was formed in the n-type Si film. In this case, the thermal conductivity of the p-type Si film having the phononic crystal was 7.6 W/(m·K), and the thermal conductivity of the n-type Si film having the phononic crystal was 7.7 W/(m·K). The thermal conductivity of the n-type Si film having the phononic crystal was higher than the thermal conductivity of the p-type Si film having the phononic crystal by only about 1%. It is conceivable that, when a thermocouple is formed by using such p-type Si film and n-type Si film, a thermal stress generated in the thermocouple is low.

Comparative Example 1

A p-type Si film having a phononic crystal and an n-type Si film having a phononic crystal were obtained in the same way as in Example 1 except for the following. A phononic crystal having a period P of 1000 nm and a diameter D of 800 nm was formed in each of the p-type Si film and the n-type Si film. In this case, the thermal conductivity of the p-type Si film having the phononic crystal was 7.6 W/(m·K), and the thermal conductivity of the n-type Si film having the phononic crystal was 10.5 W/(m·K). The thermal conductivity of the n-type Si film having the phononic crystal was higher than the thermal conductivity of the p-type Si film having the phononic crystal by as large as about 39%.

Example 2

A p-type Si film having a phononic crystal and an n-type Si film having a phononic crystal were obtained in the same way as in Example 1 except for the following. A phononic crystal having a period P of 150 nm and a diameter D of 120 nm was formed in the p-type Si film. On the other hand, a phononic crystal having a period P of 100 nm and a diameter D of 80 nm was formed in the n-type Si film. In this case, the thermal conductivity of the p-type Si film having the phononic crystal was 1.89 W/(m·K) and the thermal conductivity of the n-type Si film having the phononic crystal was 1.91 W/(m·K). In this case, the thermal conductivity of the n-type Si film having the phononic crystal was higher than the thermal conductivity of the p-type Si film having the phononic crystal by only about 1%. It is conceivable that, when a thermocouple is formed by using such p-type Si film and n-type Si film, a thermal stress generated in the thermocouple is low.

Comparative Example 2

A p-type Si film having a phononic crystal and an n-type Si film having a phononic crystal were obtained in the same way as in Example 2 except for the following. A phononic crystal having a period P of 150 nm and a diameter D of 120 nm was formed in each of the p-type Si film and the n-type Si film. In this case, the thermal conductivity of the p-type Si film having the phononic crystal was 1.89 W/(m·K), and the thermal conductivity of the n-type Si film having the phononic crystal was 2.63 W/(m·K). The thermal conductivity of the n-type Si film having the phononic crystal was higher than the thermal conductivity of the p-type Si film having the phononic crystal by as large as about 39%.

By comparing Example 1 with Comparative Example 1 and comparing Example 2 with Comparative Example 2, it can be understood that the boundary scattering frequency of phonons in a phononic crystal tends to become higher as the period P in the phononic crystal becomes smaller. Therefore, the thermal conductivity of a p-type Si film and an n-type Si film can be reduced further as the period P of the phononic crystal becomes smaller. It can be understood that, by differentiating the period P of the phononic crystal in a p-type portion from that in an n-type portion, the difference in thermal conductivity between the p-type portion and the n-type portion of the thermocouple can be reduced. In the phononic crystal in the p-type Si film of Example 1, the distance between the nearest holes was 200 nm. On the other hand, in the phononic crystal in the n-type Si film of Example 1, the distance between the nearest holes was 80 nm. In the phononic crystal in the p-type Si film of Example 2, the distance between the nearest holes was 30 nm. On the other hand, in the phononic crystal in the n-type Si film of Example 2, the distance between the nearest holes was 20 nm. It can be understood that, by differentiating the distance between the nearest holes in the phononic crystal in the p-type portion from that in the n-type portion, the difference in thermal conductivity between the p-type portion and the n-type portion of the thermocouple can be reduced.

Example 3

A p-type Si film into which boron ions had been injected as an impurity with a dose of $4 \times 10^{15}$ cm$^{-2}$ and an n-type Si film into which phosphorous ions had been injected as an impurity with a dose of $1\times10^{16}$ cm$^{-2}$ were prepared. The thickness of each of the p-type Si film and the n-type Si film was 150 nm.

In accordance with a thermoreflectance method, the thermal conductivities of the p-type Si film and the n-type Si film were measured. Before a phononic crystal was formed, the thermal conductivity of the p-type Si film at 25° C. was 38 W/(m·K). Before a phononic crystal was formed, the thermal conductivity of the n-type Si film at 25° C. was 30 W/(m·K). It can be understood that the thermal conductivity of the p-type Si film was higher than the thermal conductivity of the n-type Si film by about 27%.

A phononic crystal was formed in each of the p-type Si film and the n-type Si film. In forming the phononic crystal, holes were arranged in a tetragonal lattice pattern, and the period P of the arrangement of the holes of the phononic crystal was regulated to 300 nm. A phononic crystal having a period P of 300 nm and a diameter D of 180 nm was formed in the p-type Si film. The ratio of the sum of the areas of holes to the area of the phononic crystal in a plan view of the phononic crystal of the p-type Si film was 28%. On the other hand, a phononic crystal having a period P of 300 nm and a diameter D of 150 nm was formed in the n-type Si film. The ratio of the sum of the areas of holes to the area of the phononic crystal in a plan view of the phononic crystal of the n-type Si film was 20%. In this case, the thermal conductivity of the p-type Si film having the phononic crystal was 11.5 W/(m·K), and the thermal conductivity of the n-type Si film having the phononic crystal was 12.1 W/(m·K). The thermal conductivity of the n-type Si film having the phononic crystal was higher than the thermal conductivity of the p-type Si film having the phononic crystal by only about 5%. It is conceivable that, when a thermocouple is formed by using such p-type Si film and n-type Si film, a thermal stress generated in the thermocouple is low.

Comparative Example 3

A p-type Si film having a phononic crystal and an n-type Si film having a phononic crystal were obtained in the same way as in Example 3 except for the following. A phononic crystal having a period P of 300 nm and a diameter D of 150 nm was formed in each of the p-type Si film and the n-type Si film. The ratio of the sum of the areas of holes to the area of the phononic crystal in a plan view of the p-type Si film and the n-type Si film was 20%. In this case, the thermal conductivity of the p-type Si film having the phononic crystal was 15.3 W/(m·K), and the thermal conductivity of the n-type Si film having the phononic crystal was 12.1 W/(m·K). The thermal conductivity of the p-type Si film having the phononic crystal was higher than the thermal conductivity of the n-type Si film having the phononic crystal by as large as about 27%.

By comparing Example 3 with Comparative Example 3, it can be understood that the boundary scattering frequency of phonons in a phononic crystal tends to become higher as the diameter of holes in the phonic crystal becomes larger. Therefore, the thermal conductivity of a p-type Si film and an n-type Si film can be reduced further as the diameter of holes in a phononic crystal becomes larger. It can be understood that, by differentiating the diameter of holes in a phononic crystal in a p-type portion from that in an n-type portion, the difference in thermal conductivity between the p-type portion and the n-type portion of the thermocouple can be reduced. In the phononic crystal in the p-type Si film of Example 3, the distance between the nearest holes was 120 nm. On the other hand, in the phononic crystal in the n-type Si film of Example 3, the distance between the nearest holes was 150 nm. It can be understood that, by differentiating the distance between the nearest holes in the phononic crystal in the p-type portion from that in the n-type portion, the difference in thermal conductivity between the p-type portion and the n-type portion of the thermocouple can be reduced.

Example 4

A p-type Si film and an n-type Bi film into each of which boron ions had been injected as an impurity with a dose of $4\times10^{15}$ cm$^{-2}$ were prepared. The thickness of each of the p-type Si film and the n-type Bi film was 150 nm.

In accordance with a thermoreflectance method, the thermal conductivities of the p-type Si film and the n-type Bi film were measured. Before a phononic crystal was formed, the thermal conductivity of the p-type Si film at 25° C. was 38 W/(m·K). On the other hand, before a phononic crystal was formed, the thermal conductivity of the n-type Bi film at 25° C. was 8 W/(m·K). It can be understood that the thermal conductivity of the p-type Si film was higher than the thermal conductivity of the n-type Bi film by about 375%.

A phononic crystal was formed in each of the p-type Si film and the n-type Bi film. In forming the phononic crystal, holes were arranged in a tetragonal lattice pattern, and the period P of the arrangement of the holes and the diameter D of the holes were regulated so that the ratio of the sum of the areas of holes to the area of the phononic crystal in a plan view of the phononic crystal became 50%. A phononic crystal having a period P of 150 nm and a diameter D of 120 nm was formed in the p-type Si film. On the other hand, a phononic crystal having a period P of 500 nm and a diameter D of 400 nm was formed in the n-type Bi film. In this case, the thermal conductivity of the p-type Si film having the phononic crystal was 2.6 W/(m·K), and the thermal conductivity of the n-type Bi film having the phononic crystal was 2.7 W/(m·K). The thermal conductivity of the n-type Bi film having the phononic crystal was higher than the thermal conductivity of the p-type Si film having the phononic crystal by only about 3%. It is conceivable that, when a thermocouple is formed by using such p-type Si film and n-type Bi film, a thermal stress generated in the thermocouple is low.

Comparative Example 4

A p-type Si film having a phononic crystal and an n-type Bi film having a phononic crystal were obtained in the same way as in Example 4 except for the following. A phononic crystal having a period P of 500 nm and a diameter D of 400 nm was formed in each of the p-type Si film and the n-type Bi film. In this case, the thermal conductivity of the p-type Si film having the phononic crystal was 9.0 W/(m·K), and the thermal conductivity of the n-type Bi film having the phononic crystal was 2.7 W/(m·K). The thermal conductivity of the p-type Si film having the phononic crystal was higher than the thermal conductivity of the n-type Bi film having the phononic crystal by as large as about 237%.

According to the Examples described above, it can be understood that, by regulating the boundary scattering frequency of phonons in a phononic crystal, even when there is a difference between the thermal conductivities of base materials, the difference in thermal conductivity between a p-type portion and an n-type portion of a thermocouple can be reduced.

INDUSTRIAL APPLICABILITY

A thermopile sensor according to the present disclosure can be used for various uses including uses as an infrared sensor.

What is claimed is:

1. A thermopile sensor comprising:
   a p-type portion that includes a p-type material and has a first phononic crystal in which first holes are arranged in a plan view; and
   an n-type portion that includes an n-type material and has a second phononic crystal in which second holes are arranged in a plan view,
   wherein the p-type portion and the n-type portion constitute a thermocouple,
   wherein a thermal conductivity of the n-type material is higher than a thermal conductivity of the p-type material,
   wherein the thermopile sensor satisfies at least one condition selected from the group consisting of the following (I) and (II):
   (I) a boundary scattering frequency of phonons in the first phononic crystal is different from a boundary scattering frequency of phonons in the second phononic crystal; and
   (II) a ratio of a sum of areas of the first holes to an area of the first phononic crystal in the plan view of the first phononic crystal is different from a ratio of a sum of areas of the second holes to an area of the second phononic crystal in the plan view of the second phononic crystal, and
   wherein the thermopile sensor satisfies at least one condition selected from the group consisting of the following (Ib) and (IIb):
   (Ib) the boundary scattering frequency of phonons in the second phononic crystal is higher than the boundary scattering frequency of phonons in the first phononic crystal; and
   (IIb) a ratio of the sum of the areas of the second holes to an area of the n-type portion in the plan view of the n-type portion is greater than a ratio of the sum of the areas of the first holes to an area of the p-type portion in the plan view of the p-type portion.

2. The thermopile sensor according to claim 1, wherein a distance between nearest two holes included in the second holes in a plan view of the second phononic crystal is shorter than a distance between nearest two holes included in the first holes in the plan view of the first phononic crystal.

3. The thermopile sensor according to claim 1, wherein the ratio of the sum of the areas of the second holes to the area of the n-type portion in the plan view of the n-type portion is greater than the ratio of the sum of the areas of the first holes to the area of the p-type portion in the plan view of the p-type portion.

4. The thermopile sensor according to claim 1, wherein a specific surface area of the second phononic crystal is greater than a specific surface area of the first phononic crystal.

5. The thermopile sensor according to claim 1, further comprising:
   a substrate; and
   a sensor layer including the thermocouple,
   wherein the sensor layer has a connection portion, a beam, and a sensing portion,
   wherein the connection portion connects the sensor layer to the substrate,
   wherein the beam is connected to the sensing portion and supports the sensing portion in a state of being separated from the substrate,
   wherein the sensing portion and the beam include the thermocouple,
   wherein the p-type portion has a positive Seebeck coefficient, and
   wherein the n-type portion has a negative Seebeck coefficient.

6. The thermopile sensor according to claim 5, wherein the sensor layer is a single layer in which the thermocouple faces the substrate.

7. The thermopile sensor according to claim 5,
   wherein the sensor layer has a support layer, and
   wherein the thermocouple is disposed on the support layer.

8. The thermopile sensor according to claim 5, wherein the sensor layer has a protective layer that covers the p-type portion and the n-type portion.

9. The thermopile sensor according to claim 5, wherein the sensing portion includes an infrared receiver.

10. A sensor array comprising:
    thermopile sensors forming a one-dimensional array or a two-dimensional array,
    wherein the thermopile sensors include the thermopile sensor according to claim 1.

* * * * *